(12) United States Patent
Park et al.

(10) Patent No.: US 12,317,700 B2
(45) Date of Patent: May 27, 2025

(54) TRANSPARENT DISPLAY DEVICE

(71) Applicant: LG Display Co., Ltd., Seoul (KR)

(72) Inventors: JaeHee Park, Paju-si (KR); SangHoon Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 458 days.

(21) Appl. No.: 17/353,578

(22) Filed: Jun. 21, 2021

(65) Prior Publication Data

US 2021/0399081 A1 Dec. 23, 2021

(30) Foreign Application Priority Data

Jun. 22, 2020 (KR) .................... 10-2020-0075690

(51) Int. Cl.
*H10K 59/131* (2023.01)
*H10K 50/86* (2023.01)
*H10K 59/35* (2023.01)

(52) U.S. Cl.
CPC ......... *H10K 59/131* (2023.02); *H10K 50/865* (2023.02); *H10K 59/353* (2023.02)

(58) Field of Classification Search
CPC .. H10K 59/131; H10K 59/353; H10K 59/121; H10K 59/1213; H10K 59/35; G09G 3/3233; G09G 2300/081; G09G 2300/0842; G09G 2300/0861; G09G 2320/0238; G09G 3/32; G09G 3/28; G09G 3/3208; G09G 3/3225; G09G 3/344; G09G 3/36; G09G 3/3266; G09G 3/3275; G09F 9/30; G09F 9/313; G09F 9/33; G09F 9/35; G09F 9/372; G09F 9/335

See application file for complete search history.

(56) References Cited

U.S. PATENT DOCUMENTS

| | | | | |
|---|---|---|---|---|
| 9,158,420 | B2* | 10/2015 | Cok | G06F 3/0412 |
| 2016/0097953 | A1* | 4/2016 | Chang | G02F 1/134336 |
| | | | | 349/139 |
| 2016/0315133 | A1* | 10/2016 | Sato | H10K 50/818 |
| 2016/0321982 | A1* | 11/2016 | Lee | G09G 3/3233 |
| 2017/0053971 | A1* | 2/2017 | Sato | H10K 59/351 |
| 2018/0114491 | A1* | 4/2018 | Tokuda | G09G 3/3233 |
| 2018/0197442 | A1* | 7/2018 | Song | H10K 59/353 |

(Continued)

FOREIGN PATENT DOCUMENTS

| | | |
|---|---|---|
| KR | 20030013149 A | 2/2003 |
| KR | 20030042603 A | 6/2003 |
| KR | 20180069367 A | 6/2018 |

*Primary Examiner* — Yasser A Abdelaziez
(74) *Attorney, Agent, or Firm* — Seed IP Law Group LLP

(57) ABSTRACT

A transparent display device may improve transmittance and definition. The transparent display device includes a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a pixel including a plurality of subpixels disposed based on an overlapping area where the first signal line and the second signal line cross each other. At least one side oriented toward the transmissive area in each of the plurality of subpixels has an inclination with respect to each of the first signal line and the second signal line.

23 Claims, 11 Drawing Sheets

(56) References Cited

U.S. PATENT DOCUMENTS

| | | | | |
|---|---|---|---|---|
| 2018/0204769 A1* | 7/2018 | Xu | ............... | H01L 29/66757 |
| 2018/0269268 A1* | 9/2018 | Cai | ............... | H10K 59/353 |
| 2018/0373104 A1* | 12/2018 | Qin | ............... | G02F 1/136227 |
| 2019/0131365 A1* | 5/2019 | Jung | ............... | H10K 59/1213 |
| 2019/0302935 A1* | 10/2019 | Clark | ............... | H10K 59/353 |
| 2022/0328611 A1* | 10/2022 | Lu | ............... | H10K 59/80522 |

\* cited by examiner

| Classification | Comparison example | Embodiment 1 | Embodiment 2 |
|---|---|---|---|
| Layout |  |  |  |
| Transparency (w/ AR) | 43.8 % | 50.0% (+6.2%p) | 49.5% (+5.7%p) |
| Aperture ratio of light emitting portion | 30.0 % | 30.0 % | 30.0 % |

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area. The transparent display device includes a black matrix between subpixels to avoid color mixture.

BRIEF SUMMARY

The inventors of the present disclosure have recognized that the black matrix arranged between subpixels causes deterioration of transmittance. The present disclosure has been made in view of the above problems in the related art as well as other technical problems, and one or more embodiments of the present disclosure provide a transparent display device that may reduce or minimize loss of light transmittance, which is caused by a black matrix.

One or more embodiments of the present disclosure provide a transparent display device that may improve definition of picture quality.

One or more embodiments of the present disclosure provide a transparent display device that may improve definition of an object or image disposed on a rear surface.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device comprising a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a pixel including a plurality of subpixels disposed based on an overlapping area where the first signal line and the second signal line cross each other. At least one side oriented toward the transmissive area in each of the plurality of subpixels has an inclination with respect to each of the first signal line and the second signal line.

In accordance with another aspect of the present disclosure, the above and other benefits can be accomplished by the provision of a transparent display device comprising a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a pixel provided in an overlapping area where the first signal line and the second signal line cross each other, including a first circuit area provided with at least one transistor and a second circuit area provided with at least one capacitor. At least one side of the second circuit area, which is oriented toward the transmissive area, has an inclination with respect to each of the first signal line and the second signal line.

BRIEF DESCRIPTION OF THE SEVERAL VIEWS OF THE DRAWINGS

The above and other benefits, features and other advantages of the present disclosure will be more clearly understood from the following detailed description taken in conjunction with the accompanying drawings, in which.

DETAILED DESCRIPTION

Figure 1:
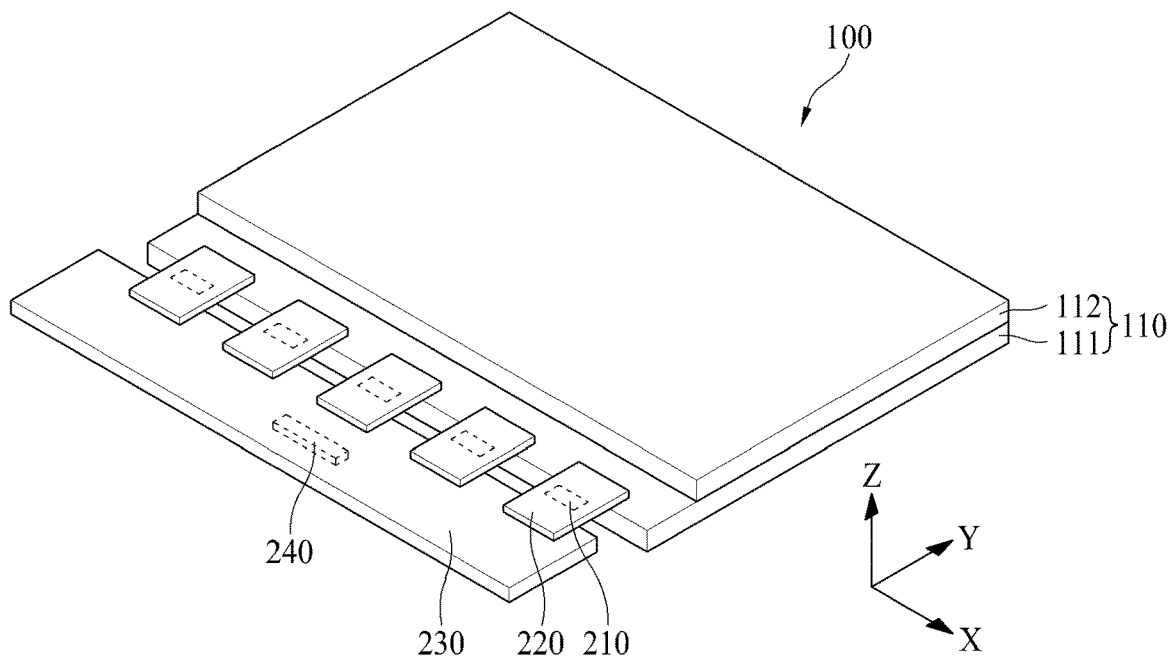
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

Figure 2:
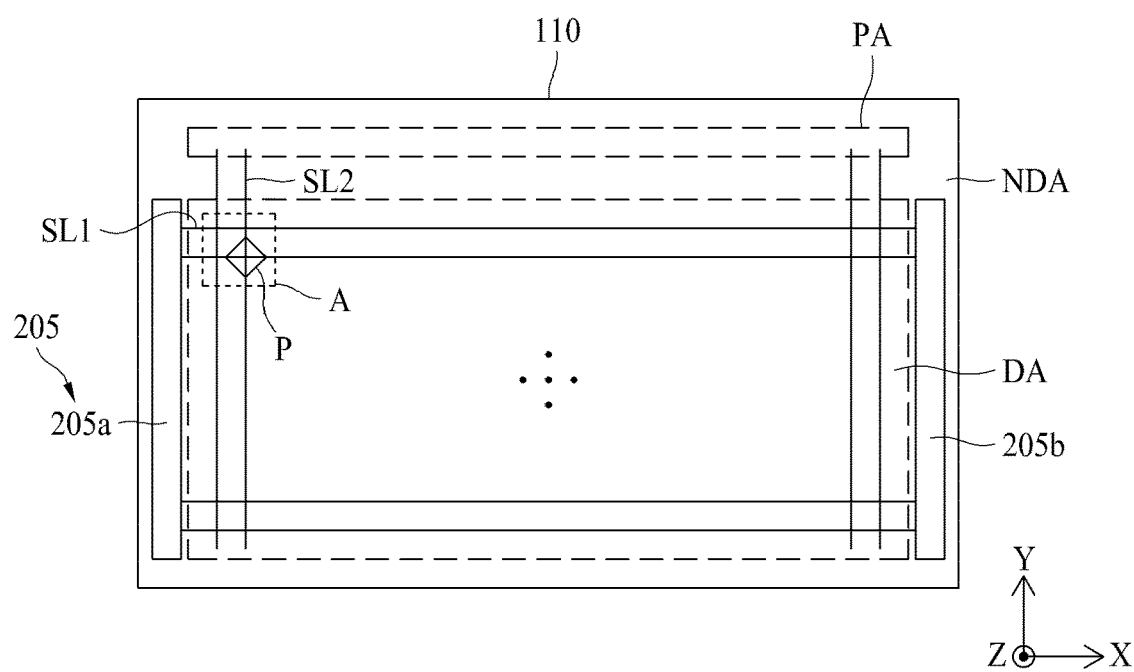
FIG. 2 is a schematic plane view illustrating a transparent display panel.

FIG. 1 is a perspective view illustrating a transparent display device according to one embodiment of the present disclosure, and FIG. 2 is a schematic plane view illustrating a transparent display panel.

Hereinafter, X axis indicates a line parallel with a gate line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1 and FIG. 2, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The substrate 111 may include a display area DA where pixels P are formed to display an image, and a non-display area NDA that does not display an image.

The display area DA may be provided with first signal lines SL1, second signal lines SL2 and pixels P, and the non-display area NDA may be provided with a pad area PA for pads and a gate driver 205.

The first signal lines SL1 may be extended in a first direction (e.g., X axis direction), and may cross the second signal lines SL2 in the display area DA. The second signal lines SL2 may be extended in a second direction (e.g., Y axis direction). The pixels P may be provided in an area where the first signal lines SL1 and the second signal lines SL2 overlap, and emit predetermined or selected light to display an image.

The gate driver 205 supplies gate signals to the gate lines in accordance with a gate control signal which is provided from the timing controller 240. The gate driver 205 may be provided in one side of the display area of the transparent display panel 110, or the non-display area of both peripheral sides of the transparent display panel 110 by a gate driver in panel (GIP) method. In another way, the gate driver 205 may be manufactured in a driving chip, may be mounted on the flexible film, and may be attached to one peripheral side or both peripheral sides of the display area of the transparent display panel 110 by a tape automated bonding (TAB) method.

For example, the gate driver 205, as shown in FIG. 2, may include a first gate driver 205a provided in the non-display area NDA disposed over a first peripheral side of the display area DA, and a second gate driver 205b provided in the non-display area NDA disposed over a second peripheral side of the display area DA, but is not limited thereto.

If the source drive IC 210 is manufactured in a driving chip, the source drive IC 140 may be mounted on the flexible film 220 by a chip on film (COF) method or a chip on plastic (COP) method.

Pads, such as power pads and data pads, may be formed in the pad area PA of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 3:
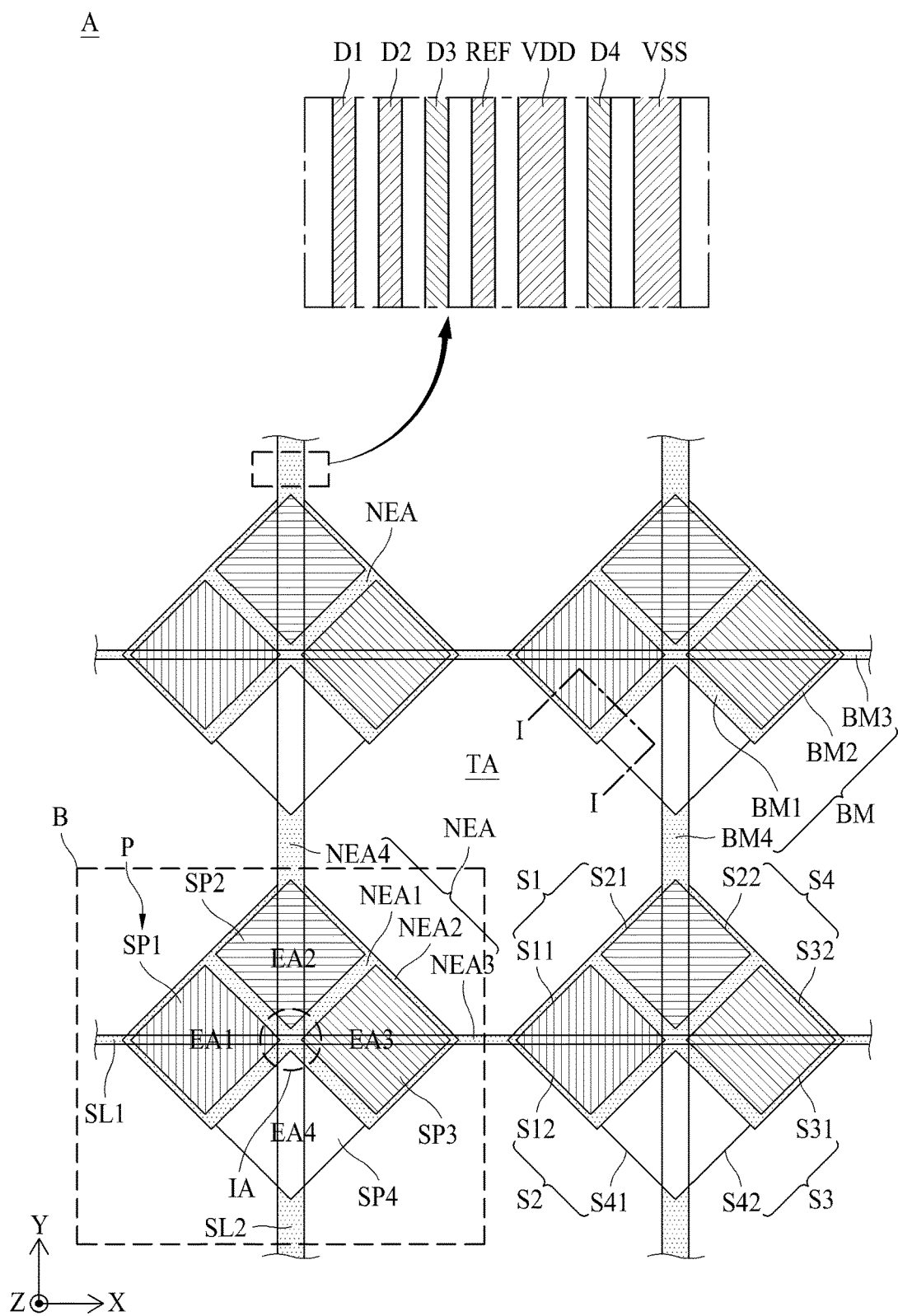
FIG. 3 is a schematic view illustrating one embodiment of a pixel provided in an area A of FIG. 2.

FIG. 3 is a schematic view illustrating one embodiment of a pixel provided in an area A of FIG. 2.

Referring to FIG. 3, a transparent display panel 110 may be categorized into a display area DA provided with pixels P to display an image, and a non-display area NDA for not displaying an image.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, 90%, and the non-transmissive area NTA may be an area where light transmittance is smaller than β%, for example, 50%. At this time, α is greater than β. A user may view an object or background arranged over a rear surface of the transparent display panel 110 due to the transmissive area TA.

A non-transmissive area NTA may be provided with a plurality of first signal lines SL1, a plurality of second signal lines SL2 and a pixel P.

The first signal lines SL1 may be extended from the display area DA in a first direction (e.g., X-axis direction). The plurality of first signal lines SL1 may be disposed to be spaced apart from one another. For example, the first signal lines SL1 may include gate lines.

The second signal lines SL2 may be extended from the display area DA in a second direction (e.g., Y-axis direction), and may cross the first signal lines SL1 in the display area DA. The plurality of second signal lines SL2 may be disposed to be spaced apart from one another.

The second signal line SL2 may include a plurality of lines. For example, the second signal line SL2 may include at least one of a pixel power line VDD, a common power line VSS, a reference line REF, or data lines D1, D2, D3 and D4.

The pixel power line VDD may supply a first power source to a driving transistor of each of subpixels SP1, SP2, SP3 and SP4 provided in the display area DA. The common power line VSS may supply a second power source to a cathode electrode of the subpixels SP1, SP2, SP3 and SP4 provided in the display area DA. At this time, the second power source may be a common power source commonly supplied to the subpixels SP1, SP2, SP3 and SP4.

When the second signal line SL2 includes a pixel power line VDD, a common power line VSS, a reference line REF and data lines D1, D2, D3 and D4, the reference line REF and the pixel power line VDD may be disposed between any one of the plurality of data lines D1, D2, D3 and D4 and the common power line VSS. For example, as shown in FIG. 3, the first data line D1, the second data line D2, the third data line D3, the reference REF, the pixel power line VDD, the fourth data line D4, and the common power line VSS may be disposed in due order.

The reference line REF and the pixel power line VDD may be diverged from an area overlapped with a part of the pixel P and connected with the plurality of subpixels SP1, SP2, SP3 and SP4. In detail, the reference line REF and the pixel power line VDD may be connected with a circuit portion of the plurality of subpixels SP1, SP2, SP3 and SP4, and may supply a reference signal or a power signal to each of the subpixels SP1, SP2, SP3 and SP4.

When the reference line REF and the pixel power line VDD are disposed outside an area where the second signal line SL2 is formed, deviation in a connection length between the diverged point and the circuit portion of each of the plurality of subpixels SP1, SP2, SP3 and SP4 is increased. For example, when the reference line REF is disposed at the leftmost of the area where the second signal line SL2 is formed, a connection length from the diverged point to the circuit portion disposed at a right side of the second signal line SL2 may be longer than a connection length from the diverged point to the circuit portion disposed at a left side of the second signal line SL2. In this case, a difference between a signal supplied to the circuit portion disposed at the right side of the second signal line SL2 and a signal supplied to the circuit portion disposed at the left side of the second signal line SL2 may occur.

In the transparent display panel 110 according to one embodiment of the present disclosure, the reference line REF and the pixel power line VDD may be disposed between any one of the plurality of data lines D1, D2, D3 and D4 and the common power line VSS, that is, in an intermediate area. That is, the reference line REF and the pixel power line VDD may reduce or minimize deviation in the connection length from the diverged point to the circuit portion of each of the subpixels SP1, SP2, SP3 and SP4. As a result, the reference line REF and the pixel power line VDD may uniformly supply a signal to the circuit portion of each of the plurality of subpixels SP1, SP2, SP3 and SP4.

On the other hand, each of the first data line D1, the second data line D2, the third data line D3 and the fourth data line D4 may be connected with one circuit portion of the plurality of subpixels SP1, SP2, SP3 and SP4 in an area overlapped with the pixel P, and thus may supply a data signal to the connected subpixels SP1, SP2, SP3 and SP4. Since each of the first data line D1, the second data line D2, the third data line D3 and the fourth data line D4 is connected with only one of the subpixels SP1, SP2, SP3 and SP4 in the area overlapped with the pixel P, it is not required to consider deviation in a connection length among the subpixels SP1, SP2, SP3 and SP4.

A transmissive area TA may be disposed between the first signal lines SL1 adjacent to each other. Also, the transmissive area TA may be disposed between the second signal lines SL2 adjacent to each other. That is, the transmissive area TA may be surrounded or at least partially surrounded by two first signal lines SL1 and two second signal lines SL2.

The pixels P are provided in the overlapping area IA where the first signal line SL1 the second signal line SL2 cross each other, and display an image by emitting predetermined or selected light. An emission area EA may correspond to an area for emitting light in the pixel P.

Each of the pixels P may include a first subpixel SP1, a second subpixel SP2, a third subpixel SP3 and a fourth subpixel SP4, as shown in FIG. 3. The first subpixel SP1 may include a first emission area EA1 disposed to overlap the first signal line SL1, emitting light of a first color. The second subpixel SP2 may include a second emission area EA2 disposed to overlap the second signal line SL2, emitting light of a second color. The third subpixel SP3 may include a third emission area EA3 disposed to face the first subpixel SP1 based on the overlapping area IA, emitting light of a third color. The fourth subpixel SP4 may include a fourth emission area EA4 disposed to face the second subpixel SP2 based on the overlapping area IA, emitting light of a fourth color.

As an example, the first to fourth emission areas EA1, EA2, EA3 and EA4 may respectively emit light of respective colors different from one another. For example, the first emission area EA1 may emit green light, and the second emission area EA2 may emit red light. The third emission area EA3 may emit blue light, and the fourth emission area EA4 may emit white light. However, the emission areas are not limited to this example.

As another example, at least two of the first to fourth emission areas EA1, EA2, EA3 and EA4 may emit light of the same color. For example, the first emission area EA1 and the second emission area EA2 may emit green light, the third emission area EA2 may emit red light, and the fourth emission area EA4 may emit blue light. However, the emission areas are not limited to this example.

Also, the arrangement order of the subpixels SP1, SP2, SP3 and SP4 may be changed in various ways.

Hereinafter, for convenience of description, the first subpixel SP1 is a green subpixel for emitting green light, the second subpixel SP2 is a red subpixel for emitting red light, the third subpixel SP3 is a blue subpixel for emitting blue light, and the fourth subpixel SP4 is a white subpixel for emitting white light.

In the transparent display panel 110 according to one embodiment of the present disclosure, the pixel P may include a plurality of sides oriented toward the transmissive area TA, and each of the plurality of sides of the pixel P is inclined with respect to each of the first signal line SL1 and the second signal line SL2.

In detail, the pixel P may include first and second sides S1 and S2 oriented toward the transmissive area TA, a third side S3 facing the first side S1, and a fourth side S4 facing the second side S2. For example, the pixel P may have a rhombus shape comprised of four sides S1, S2, S3 and S4. In this case, the transmissive area TA may have a rhombus shape, a hexagonal shape or an octagonal shape in accordance with a size and arrangement of the pixel P.

Each of the first side S1, the second side S2, the third side S3 and the fourth side S4 of the pixel P may be inclined without being parallel with or vertical to the first signal line SL1. That is, each of the first side S1, the second side S2, the third side S3 and the fourth side S4 of the pixel P may have an inclination of 0° to 90° with respect to the first signal line SL1. For example, each of the first side S1, the second side S2, the third side S3 and the fourth side S4 of the pixel P may be comprised of an oblique line having an inclination of 30° to 60° with respect to the first signal line SL1.

Also, each of the first side S1, the second side S2, the third side S3 and the fourth side S4 of the pixel P may be inclined without being parallel with or vertical to the second signal line SL2. That is, each of the first side S1, the second side S2, the third side S3 and the fourth side S4 of the pixel P may have an inclination of 0° to 90° with respect to the second signal line SL2. For example, each of the first side S1, the second side S2, the third side S3 and the fourth side S4 of the pixel P may be comprised of an oblique line having an inclination of 30° to 60° with respect to the second signal line SL2.

Meanwhile, each of the first side S1, the second side S2, the third side S3 and the fourth side S4 of the pixel P may include a side of each of two or more subpixels SP1, SP2, SP3 and SP4.

Each of the plurality of subpixels SP1, SP2, SP3 and SP4 may include at least two sides oriented toward the transmissive area TA. For example, each of the plurality of subpixels SP1, SP2, SP3 and SP4 may have the same or substantially same shape as that of the pixel P, for example, a rhombus shape.

In this case, each of the plurality of subpixels SP1, SP2, SP3 and SP4 may include two sides oriented toward the transmissive area TA. The first subpixel SP1 may include first and second sides S11 and S12 oriented toward the transmissive area TA, the second subpixel SP2 may include first and second sides S21 and S22 oriented toward the transmissive area TA, the third subpixel SP3 may include first and second sides S31 and S32 oriented toward the transmissive area TA, and the fourth subpixel SP4 may include first and second sides S41 and S42 oriented toward the transmissive area TA.

The first side S1 of the pixel P may include the first side S11 of the first subpixel SP1 and the first side S21 of the second subpixel SP2, and the second side S2 of the pixel P may include the second side S2 of the first subpixel SP1 and the first side S41 of the fourth subpixel SP4. The third side S3 of the pixel P may include the second side S42 of the fourth subpixel SP4 and the first side S31 of the third subpixel SP3, and the fourth side S4 of the pixel P may include the second side S32 of the third subpixel SP3 and the second side S22 of the second subpixel SP2.

Consequently, the first sides S11, S21, S31 and S41 and the second sides S12, S22, S32 and S42 of each of the plurality of subpixels SP1, SP2, SP3 and SP4 are inclined with respect to each of the first signal line SL1 and the second signal line SL2 in the same or similar manner as the plurality of sides S1, S2, S3 and S4 of the pixel P.

The non-transmissive area NTA may include an emission area EA and a non-emission area NEA.

The emission area EA may be provided with the plurality of subpixels SP1, SP2, SP3 and SP4 to emit light of a predetermined or selected color, and may include a first emission area EA1, a second emission area EA2, a third emission area EA3 and a fourth emission area EA4, which are respectively provided in the plurality of subpixels SP1, SP2, SP3 and SP4.

The non-emission area NEA may not emit light, and may include a first non-emission area NEA1 provided among the subpixels SP1, SP2, SP3 and SP4, a second non-emission area NEA2 provided between each of the plurality of subpixels SP1, SP2, SP3 and SP4 and the transmissive area TA, a third non-emission area NEA3 provided between the pixels P disposed to be adjacent to each other in a first direction, and a fourth non-emission area NEA4 provided between the pixels P disposed to be adjacent to each other in a second direction.

The non-emission area NEA may be provided with a black matrix BM. The black matrix BM may include a first black matrix BM1, a second black matrix BM2, a third black matrix BM3, and a fourth black matrix BM4.

The first black matrix BM1 may be provided among the plurality of subpixels SP1, SP2, SP3 and SP4 to prevent color mixture from occurring among the plurality of subpixels SP1, SP2, SP3 and SP4.

The second black matrix BM2 may be provided between each of the plurality of subpixels SP1, SP2, SP3 and SP4 and the transmissive area TA to prevent light emitted from each of the plurality of subpixels SP1, SP2, SP3 and SP4 from being seen as light of another color depending on a viewing angle. In one embodiment, the second black matrix BM2 may not be provided between the fourth subpixel SP4 and the transmissive area TA. When the fourth subpixel SP4 is a white pixel for emitting white light, the white light emitted from the fourth subpixel SP4 is not varied depending on a viewing angle. Therefore, the second black matrix BM2 is not provided between the fourth subpixel SP4 and the transmissive area TA, whereby transmittance may be improved and light loss caused by the second black matrix BM2 may be reduced.

The third black matrix BM3 may be provided between the pixels P disposed to be adjacent to each other in a first direction, thereby preventing color mixture from occurring between the pixels P disposed to be adjacent to each other in the first direction, and preventing externally incident light from being reflected in the first signal line SL1.

The fourth black matrix BM4 may be provided between the pixels P disposed to be adjacent to each other in a second direction, thereby preventing color mixture from occurring between the pixels P disposed to be adjacent to each other in the second direction, and preventing externally incident light from being reflected in the second signal line SL2.

Since the black matrix BM is made of a material that shields or absorbs light, the light emitted from the subpixels SP1, SP2, SP3 and SP4 may not pass through the area where the black matrix BM is formed and the externally incident light may not transmit the area where the black matrix BM is formed. Therefore, the area where the black matrix BM is formed corresponds to the non-emission area NEA from which light is not emitted.

Since the black matrix BM shields or absorbs light, the black matrix BM may greatly affect transmittance of the transparent display panel 110. In detail, transmittance of the transparent display panel 110 may be reduced when the area where the black matrix BM is formed, that is, the non-emission area NEA is increased. On the other hand, transmittance of the transparent display panel 110 may be increased when the non-emission area NEA is reduced.

The transparent display panel 110 according to one embodiment of the present disclosure has a pixel P structure for reducing the area where the black matrix BM is formed, that is, the non-emission area NEA. In the transparent display panel 110 according to one embodiment of the present disclosure, the pixel P is provided in the overlapping area IA where the first signal line SL1 and the second signal line SL2 cross each other, and the plurality of sides S1, S2, S3 and S4 of the pixel P are inclined with respect to each of the first signal line SL1 and the second signal line SL2. In the transparent display panel 110 having the pixel P described as above, the plurality of sides S1, S2, S3 and S4 may reduce an outer length of the transmissive area TA as compared with the transparent display panel having a pixel P parallel with or vertical to the first signal line SL1 and the second signal line SL2.

That is, the transparent display panel 110 according to one embodiment of the present disclosure may reduce a total size of the second black matrix BM2 provided between each of the subpixels SP1, SP2, SP3 and SP4 and the transmissive area TA, the third black matrix BM3 provided between the pixels P disposed to be adjacent to each other in the first direction and the fourth black matrix BM4 provided between the pixels P disposed to be adjacent to each other in the second direction. Therefore, the transparent display panel 110 according to one embodiment of the present disclosure may improve transmittance as the area where the black matrix BM is formed, that is, the non-emission area NEA is reduced.

Also, in the transparent display panel 110 according to one embodiment of the present disclosure, one pixel P is provided in the overlapping area IA where the first signal line SL1 and the second signal line SL2 cross each other, and the pixel P includes the plurality of subpixels SP1, SP2, SP3 and SP4 disposed based on the overlapping area IA. In the transparent display panel 110 according to one embodiment of the present disclosure, the plurality of subpixels SP1, SP2, SP3 and SP4 are together disposed based on the overlapping area IA, whereby definition of picture quality and readability may be improved.

Also, in the transparent display panel 110 according to one embodiment of the present disclosure, each of the sides S1, S2, S3 and S4 of the pixel P may include a side of each of at least two subpixels SP1, SP2, SP3 and SP4. In this case, in the transparent display panel 110 according to one embodiment of the present disclosure, the first non-emission area NEA1 provided among the plurality of subpixels SP1, SP2, SP3 and SP4 may be inclined with respect to each of the first signal line SL1 and the second signal line SL2. For example, the black matrix BM may be provided from the overlapping area IA to an intermediate point of each of the sides S1, S2, S3 and S4 of the pixel P. In this way, the transparent display panel 110 provided with the black matrix BM may reduce the first non-emission area NEA1 as compared with the transparent display panel provided with the black matrix BM along the first signal line SL1 or the second signal line SL2 among the plurality of subpixels SP1, SP2, SP3 and SP4.

That is, the transparent display panel 110 according to one embodiment of the present disclosure may reduce the size of the first black matrix BM1 provided among the subpixels SP1, SP2, SP3 and SP4. Therefore, the transparent display panel 110 according to one embodiment of the present disclosure may improve transmittance as the area where the black matrix BM is formed, that is, the non-emission area NEA is reduced.

Hereinafter, the structure of the pixel P will be described in more detail with reference to FIGS. 4 to 6.

Figure 4:
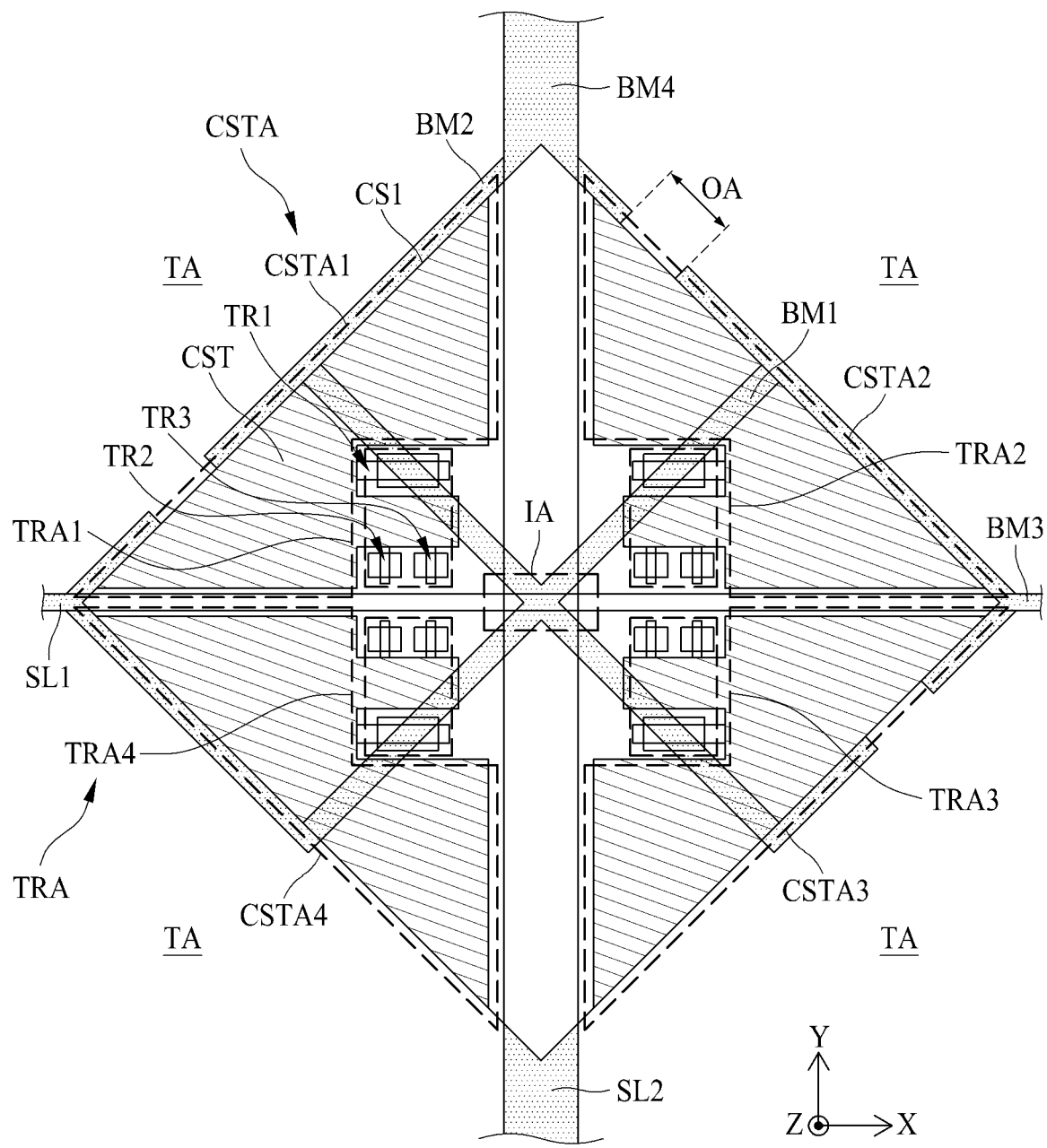
FIG. 4 is a schematic view illustrating a transistor and a capacitor in an area B of FIG. 3.
Figure 5:
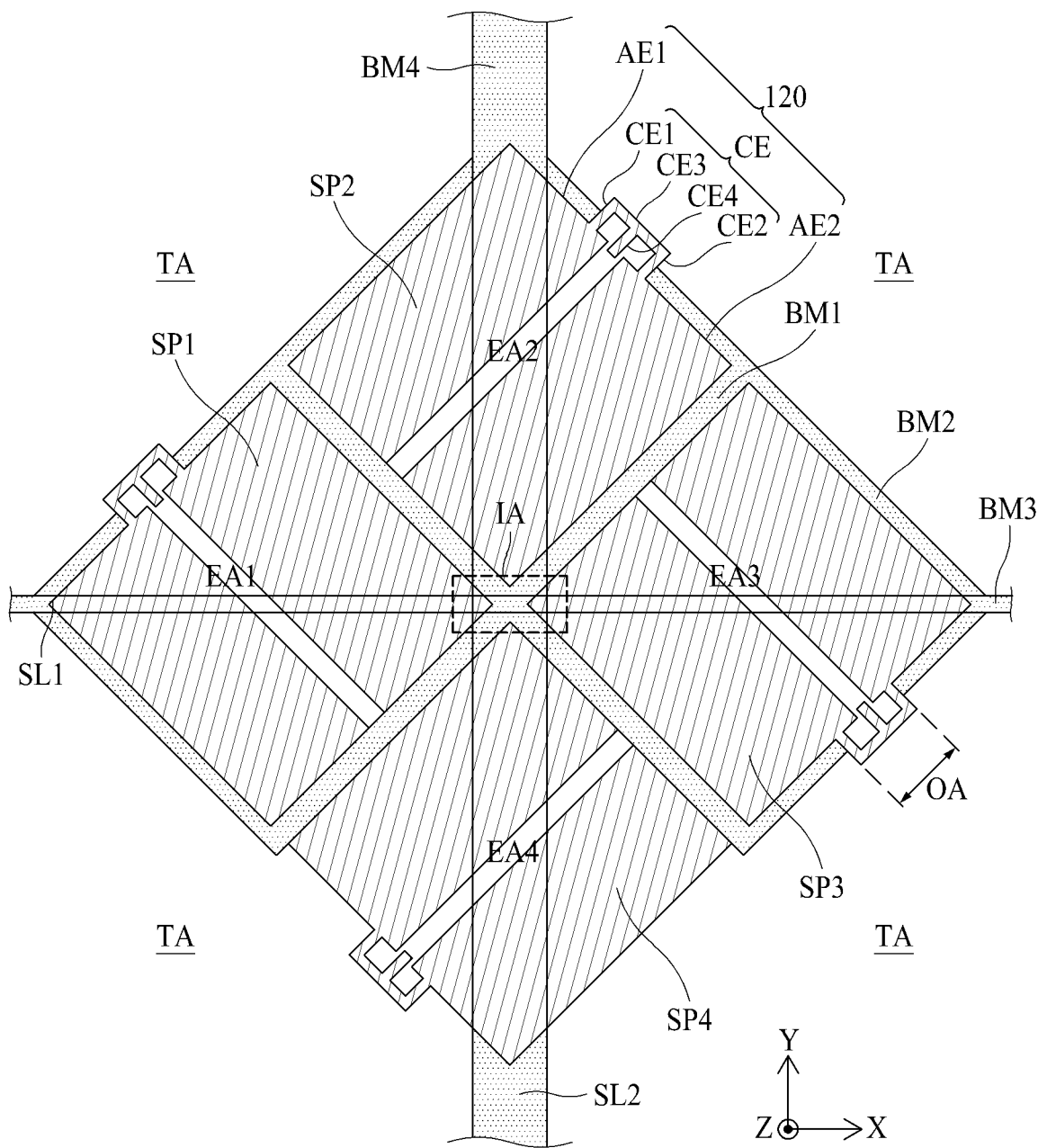
FIG. 5 is a schematic view illustrating a first electrode in an area B of FIG. 3.
Figure 6:
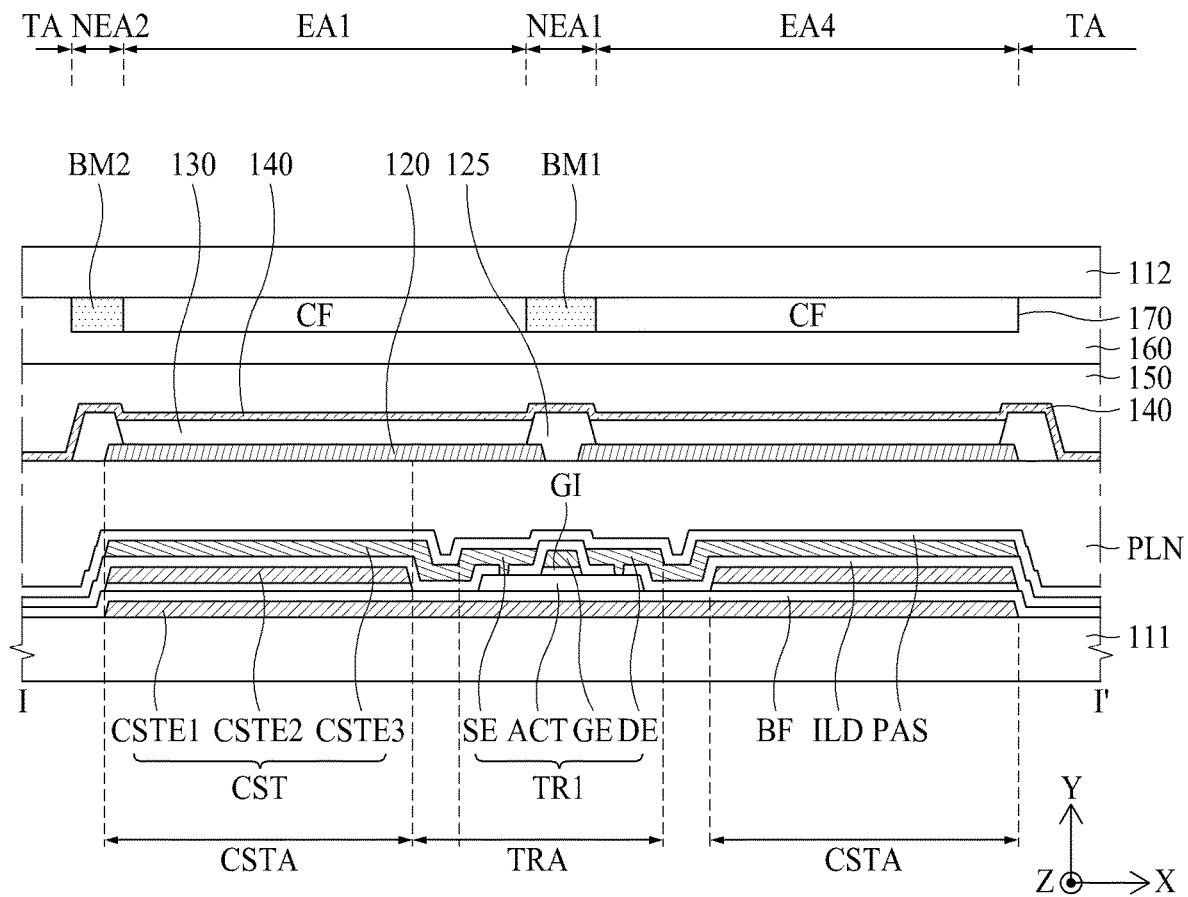
FIG. 6 is a cross-sectional view taken along line I-I' of FIG. 3.

FIG. 4 is a schematic view illustrating a transistor and a capacitor in an area B of FIG. 3, FIG. 5 is a schematic view illustrating a first electrode in an area B of FIG. 3, and FIG. 6 is a cross-sectional view taken along line I-I' of FIG. 3.

Referring to FIGS. 4 to 6, the pixel P may include a first subpixel SP1, a second subpixel SP2, a third subpixel SP3 and a fourth subpixel SP4. Each of the plurality of subpixels SP1, SP2, SP3 and SP4 may include a circuit element, which includes at least one or more transistors TR1, TR2 and TR3 and a capacitor CST, and a light emitting diode.

At least one or more transistors may include a driving transistor TR1, a switching transistor TR2 and a sensing transistor TR3.

The switching transistor TR2 is switched in accordance with a gate signal supplied to a gate line and charges a data voltage supplied from a data line in the capacitor CST.

The sensing transistor TR3 serves to sense a threshold voltage deviation of the driving transistor TR1, which causes deterioration of picture quality, in accordance with a sensing signal.

The driving transistor TR1 is switched in accordance with the data voltage charged in the capacitor CST to generate a data current from a power source supplied from the pixel power line VDD, and then serves to supply the generated data current to a first electrode 120 of the subpixels SP1, SP2, SP3 and SP4.

The driving transistor TR1 may include an active layer ACT, a gate electrode GE, a source electrode SE and a drain electrode DE, and the capacitor CST may include a first capacitor electrode CSTE1, a second capacitor electrode CSTE2 and a third capacitor electrode CSTE3.

In detail, the first capacitor electrode CSTE1 may be provided over the first substrate 111. The first capacitor electrode CSTE1 may serve as a light shielding layer for shielding external light entering the active layer ACT from an area TRA where the driving transistor TR1 is formed. The first capacitor electrode CSTE1 may be formed of a single layer or a multi-layer made of any one of Mo, Al, Cr, Au, Ti, Ni, Nd and Cu, or their alloy.

A buffer film BF may be provided over the first capacitor electrode CSTE1 and the light shielding layer (not shown). The buffer film BF is intended to protect the transistors TR1, TR2 and TR3 and the capacitor CST from moisture permeated through the first substrate 111 vulnerable to moisture permeability, and may be formed of an inorganic film, for example, a silicon oxide film (SiOx), a silicon nitride film (SiNx) or a multi-layered film of SiOx and SiNx.

The active layer ACT may be provided over the buffer film BF. The active layer ACT may be formed of a silicon based semiconductor material or an oxide based semiconductor material.

A gate insulating film GI may be provided over the active layer ACT. The gate insulating film GI may be formed of an inorganic film, for example, a silicon oxide film (SiOx), a silicon nitride film (SiNx) or a multi-layered film of SiOx and SiNx.

The gate electrode GE and the second capacitor electrode CSTE2 may be provided over the gate insulating film GI. The second capacitor electrode CSTE2 may be extended from the gate electrode GE. The gate electrode GE and the second capacitor electrode CSTE2 may be formed of a single layer or a multi-layer made of any one of Mo, Al, Cr, Au, Ti, Ni, Nd and Cu, or their alloy.

Although FIG. 6 illustrates that the driving transistor TR1 is formed in a top gate method in which the gate electrode GE is disposed above the active layer ACT, the driving transistor TR1 s not limited to the example of FIG. 6. The driving transistor TR1 may be formed in a bottom gate method in which the gate electrode GE is disposed below the active layer ACT or a double gate method in which the gate electrode GE is disposed above and below the active layer ACT.

An inter-layer dielectric film ILD may be provided over the gate electrode GE and the second capacitor electrode CSTE2. The inter-layer dielectric film ILD may be made of an inorganic film, for example, a silicon oxide film (SiOx), a silicon nitride film (SiNx) or a multi-layered film of SiOx and SiNx.

The source electrode SE, the drain electrode DE and the third capacitor electrode CSTE3 may be provided over the inter-layer dielectric film ILD. The third capacitor electrode CSTE3 may be extended from the source electrode SE. The source electrode SE and the drain electrode DE may be connected to the active layer ACT through a contact hole passing through the gate insulating film GI and the inter-layer dielectric film ILD.

The source electrode SE, the drain electrode DE and the third capacitor electrode CSTE3 may be made of a single layer or a multi-layer of any one of Mo, Al, Cr, Au, Ti, Ni, Nd and Cu, or their alloy.

A passivation film PAS for insulating the driving transistor TR1 from the capacitor CST may be provided over the source electrode SE, the drain electrode DE and the third capacitor electrode CSTE3. The passivation film PAS may be made of an inorganic film, for example, a silicon oxide film (SiOx), a silicon nitride film (SiNx) or a multi-layered film of SiOx and SiNx.

Although FIG. 6 illustrates that the capacitor CST includes a first capacitor electrode CSTE1, a second capacitor electrode CSTE2 and a third capacitor electrode CSTE3, the capacitor is not limited to the example of FIG. 6. The capacitor CST may include at least two or more of the capacitor electrodes.

The circuit element provided as described above may include a first circuit area TRA provided with at least one or more transistors TR1, TR2 and TR3 and a second circuit area CSTA provided with a capacitor CST, as shown in FIG. 4.

The first circuit area TRA may include a first transistor area TRA1 disposed between the first signal line SL1 and the second signal line SL2, a second transistor area TRA2 disposed to be symmetrical with the first transistor area TRA1 based on the second signal line SL2, a third transistor area TRA3 disposed to be symmetrical with the second transistor area TRA2 based on the first signal line SL1, and a fourth transistor area TRA4 disposed to be symmetrical with the first transistor area TRA1 based on the second signal line SL2.

The driving transistor TR1, the switching transistor TR2 and the sensing transistor TR3 may be provided in each of the first to fourth transistor areas TRA1, TRA2, TRA3 and TRA4.

The second circuit area CSTA may be disposed between the first circuit area TRA and the transmissive area TA. In detail, the second circuit area CSTA may include a first capacitor area CSTA1 disposed between the first transistor area TRA1 and the transmissive area TA, a second capacitor area CSTA2 disposed between the second transistor area TRA2 and the transmissive area TA, a third capacitor area CSTA3 disposed between the third transistor area TRA3 and the transmissive area TA, and a fourth capacitor area CSTA4 disposed between the fourth transistor area TRA4 and the transmissive area TA.

The capacitor CST may be provided in each of the first to fourth capacitor areas CSTA1, CSTA2, CSTA3 and CSTA4.

The driving transistor TR1 of the first transistor area TRA1 may be switched in accordance with the data voltage charged in the capacitor CST of the first capacitor area CSTA1 to supply the power source supplied from the pixel power line VDD to the first electrode 120 of the first subpixel SP1. Also, the driving transistor TR1 of the second transistor area TRA2 may be switched in accordance with the data voltage charged in the capacitor CST of the second capacitor area CSTA2 to supply the power source supplied from the pixel power line VDD to the first electrode 120 of the second subpixel SP2. The driving transistor TR1 of the third transistor area TRA3 may be switched in accordance with the data voltage charged in the capacitor CST of the third capacitor area CSTA3 to supply the power source supplied from the pixel power line VDD to the first electrode 120 of the third subpixel SP3. The driving transistor TR1 of the fourth transistor area TRA4 may be switched in accordance with the data voltage charged in the capacitor CST of the fourth capacitor area CSTA4 to supply the power source supplied from the pixel power line VDD to the first electrode 120 of the fourth subpixel SP4.

In the transparent display panel 110 according to one embodiment of the present disclosure, the first circuit area TRA and the second circuit area CSTA may be disposed so as not to overlap the first signal line SL1 and the second signal line SL2. In the transparent display panel 110 according to one embodiment of the present disclosure, at least one or more transistors TR1, TR2 and TR3 and the capacitor CST may not overlap the first signal line SL1 and the second signal line SL2, whereby a parasitic cap may be prevented from being generated between electrodes which overlap each other.

Also, in the transparent display panel 110 according to one embodiment of the present disclosure, the first circuit area TRA may be disposed to be more adjacent to the overlapping area IA than the second circuit area CSTA. At least one or more transistors TR1, TR2 and TR3 provided in the first circuit area TRA may be connected with a connection line diverged from at least one of the first signal line SL1 or the second signal line SL2. In the transparent display panel 110 according to one embodiment of the present disclosure, the first circuit area TRA may be disposed to be adjacent to the overlapping area IA, whereby a length of connection line for connecting the transistors TR1, TR2 and TR3 with the signal lines SL1 and SL2 may be reduced or minimized. As a result, the transparent display panel 110 according to one embodiment of the present disclosure may reduce or minimize loss of the voltage, which is transferred from the first signal line SL1 or the second signal line SL2, due to resistance.

Meanwhile, in the transparent display panel 110 according to one embodiment of the present disclosure, the second circuit area CSTA may be disposed between the first circuit area TRA and the transmissive area TA. In this case, a shape of the transmissive area TA may be determined by the capacitor CST provided in the second circuit area CSTA.

In the capacitor CST, at least one side oriented toward the transmissive area TA may have the same or substantially the same shape as that of the pixel P. In detail, in the capacitor CST, at least one side oriented toward the transmissive area TA may be inclined with respect to each of the first signal line SL1 and the second signal line SL2.

The capacitor CST provided in each of the first to fourth capacitor areas CSTA1, CSTA2, CSTA3 and CSTA4 may include one first side CS1 oriented toward the transmissive area TA.

The first side CS1 of the capacitor CST may be inclined without being parallel with or vertical to the first signal line SL1. That is, the first side CS1 of the capacitor CST may have an inclination of 0° to 90° with respect to the first signal line SL1. For example, the first side CS1 of the capacitor CST may be comprised of a straight line having an inclination of 30° to 60° with respect to the first signal line SL1.

Also, the first side CS1 of the capacitor CST may be inclined without being parallel with or vertical to the second signal line SL2. That is, the first side CS1 of the capacitor CST may have an inclination of 0° to 90° with respect to the second signal line SL2. For example, the first side CS1 of the capacitor CST may be comprised of a straight line having an inclination of 30° to 60° with respect to the second signal line SL2.

The capacitor CST may be provided to have a maximum wide area in an area excluding the second circuit area CSTA, the first signal line SL1 and the second signal line SL2 from the pixel P. To this end, in the transparent display panel 110 according to one embodiment of the present disclosure, the first side CS1 of the capacitor CST may have the same or substantially the same shape as that of the side of the subpixels SP1, SP2, SP3 and SP4, which is oriented toward the transmissive area TA. Moreover, in the transparent display panel 110 according to one embodiment of the present disclosure, an end of the first side CS1 of the capacitor CST may be equal to that of the side of the subpixels SP1, SP2, SP3 and SP4, which is oriented toward the transmissive area TA. In one embodiment, the capacitor CST may have the same end as that of the first electrode 120 at the side oriented toward the transmissive area TA.

The transparent display panel 110 according to one embodiment of the present disclosure described as above may make sure of maximum capacity of the capacitor CST and improve luminance.

Also, in the transparent display panel 110 according to one embodiment of the present disclosure, the shape of the transmissive area TA may freely be changed depending on the shape of the first side CS1 of the capacitor CST, whereby a degree of freedom in design of the transmissive area TA may be acquired without loss of transmittance.

Referring to FIG. 6 again, a planarization film PLN for planarizing a step difference caused by the driving transistor TR1 and the capacitor CST may be provided over the passivation film PAS. The planarization film PLN may be formed of an organic film such as acryl resin, epoxy resin, phenolic resin, polyamide resin, and polyimide resin.

The light emitting diode, which is comprised of a first electrode 120, an organic light emitting layer 130 and a second electrode 130, and a bank 125 may be provided over the planarization film PLN.

The first electrode 120 may be provided over the planarization film PLN for each of the subpixels SP1, SP2, SP3 and SP4. The first electrode 120 is not provided in the transmissive area TA.

The first electrode 120 may be connected with the driving transistor TR1. In detail, the first electrode 120 may be connected to one of the source electrode SE and the drain electrode DE through a contact hole passing through the planarization film PLN. For example, the first electrode 120 may be connected to the source electrode SE or the third capacitor electrode CSTE3 extended from the source electrode SE through the contact hole passing through the planarization film PLN.

In one embodiment, the first electrode 120, as shown in FIG. 5, may include a first anode electrode AE1, a second anode electrode AE2 and a connection electrode CE.

The first anode electrode AE1 and the second anode electrode AE2 may be spaced apart from each other on the same layer. The connection electrode CE may be formed on the same layer as the first anode electrode AE1 and the second anode electrode AE2 to connect the first anode electrode AE1 with the second anode electrode AE2. The first anode electrode AE1, the second anode electrode AE2 and the connection electrode CE may be formed in a single body.

The connection electrode CE may include a first connection portion CE1, a second connection portion CE2, a third connection portion CE3 and a fourth connection portion CE4. The first connection portion CE1 may be extended from the first anode electrode AE1 toward the transmissive area TA as much as a predetermined or selected length, and the second connection portion CE2 may be extended from the second anode electrode AE2 toward the transmissive area TA as much as a predetermined or selected length. The third connection portion CE3 may connect the first connection portion CE1 with the second connection portion CE2. The fourth connection portion CE4 may be extended from the third connection portion CE3, and may electrically be connected with the source electrode SE or the drain electrode DE of the driving transistor TR1 through a contact hole. Although FIG. 5 shows that the connection electrode CE includes the fourth connection portion CE4, the present disclosure is not limited the example of FIG. 5. The fourth connection portion CE4 may be omitted from the connection electrode CE. In this case, the third connection portion CE3 may electrically be connected with the source electrode SE or the drain electrode DE of the driving transistor TR1 through a contact hole.

In the transparent display panel 110 according to one embodiment of the present disclosure, when any one of the first anode electrode AE1 and the second anode electrode AE2 operates in error due to particles that may occur during a process, at least one of the first connection portion CE1, the second connection portion CE2, the third connection portion CE3 or the fourth connection portion CE4 of the connection electrode CE may be subjected to short-circuit for repair. Also, the transparent display panel 110 according to one embodiment of the present disclosure may repair the anode electrode subjected to short-circuit by connecting the corresponding anode electrode to an anode electrode of another subpixel adjacent thereto by using a repair line (not shown).

In the transparent display panel 110 according to one embodiment of the present disclosure, the first electrode 120 may be formed such that the connection electrode CE of one of the subpixels SP1, SP2, SP3 and SP4 may only be disposed at each of the plurality of sides S1, S2, S3 and S4 of the pixel P. For example, at the first side S1 of the pixel P, the connection electrode CE of the first electrode 120 of the first subpixel SP1 may be protruded toward the transmissive area TA, and at the second side S2 of the pixel P, the connection electrode CE of the first electrode 120 of the fourth subpixel SP4 may be protruded toward the transmissive area TA. At the third side S3 of the pixel P, the connection electrode CE of the first electrode 120 of the third subpixel SP3 may be protruded toward the transmissive area TA, and at the fourth side S4 of the pixel P, the connection electrode CE of the first electrode 120 of the second subpixel SP2 may be protruded toward the transmissive area TA.

In this way, in the transparent display panel 110 according to one embodiment of the present disclosure, the connection electrodes CE of the subpixels SP1, SP2, SP3 and SP4 may be disposed to be spaced apart from one another if possible, whereby the connection electrodes CE of the subpixels SP1, SP2, SP3 and SP4 adjacent to one another may be prevented from being damaged during a repair process.

Although FIG. 5 shows that the first electrode 120 includes the first anode electrode AE1 the second anode electrode AE2 and the connection electrode CE, the present disclosure is not limited to the example of FIG. 5. The first electrode 120 may be comprised of one anode electrode.

The first electrode 120 may be made of a metal material of high reflectance such as a deposited structure (Ti/Al/Ti) of Al and Ti, a deposited structure (ITO/Al/ITO) of Al and ITO, Ag alloy, and a deposited structure (ITO/Ag alloy/ITO) of Ag alloy and ITO. The Ag alloy may be an alloy of Ag, Pd and Cu. The first electrode 120 may be an anode electrode.

The bank 125 may be provided over the planarization film PLN. Also, the bank 125 may be formed to cover or at least partially cover the edge of the first electrode 120 and partially expose the first electrode 120. In detail, the bank 125 may be formed to cover or at least partially cover the edge of each of the first anode electrode AE1 and the second anode electrode AE2 and expose a portion of each of the first anode electrode AE1 and the second anode electrode AE2.

The bank 125 may define emission areas EA1, EA2, EA3 and EA4 of the subpixels SP1, SP2, SP3 and SP4, respectively. The emission areas EA1, EA2, EA3 and EA4 of the subpixels SP1, SP2, SP3 and SP4 denote areas where the first electrode 120, the organic light emitting layer 130 and the second electrode 140 are sequentially deposited and then holes from the first electrode 120 and electrons from the second electrode 140 are combined with each other in the organic light emitting layer 130 to emit light. In this case, since the area where the bank 125 is formed does not emit light, the area may become the non-emission area NEA, and the area where the bank 125 is not formed and the first electrode 120 is exposed may become the emission area EA.

The bank 125 may be formed of an organic film such as acryl resin, epoxy resin, phenolic resin, polyamide resin, and polyimide resin.

The organic light emitting layer 130 may be provided over the first electrode 120. The organic light emitting layer 130 may include a hole transporting layer, a light emitting layer, and an electron transporting layer. In this case, when a voltage is applied to the first electrode 120 and the second electrode 140, the holes and the electrons move to the light emitting layer through the hole transporting layer and the electron transporting layer, respectively, and are combined with each other in the light emitting layer to emit light.

In one embodiment, the organic light emitting layer 130 may be a common layer commonly formed in the subpixels SP1, SP2, SP3 and SP4. At this time, the light emitting layer 130 may be a white light emitting layer for emitting white light.

In another embodiment, the organic light emitting layer 130 may include light emitting layers respectively formed for the subpixels SP1, SP2, SP3 and SP4 as shown in FIG. 6. For example, a green light emitting layer for emitting green light may be formed in the first subpixel SP1, a red light emitting layer for emitting red light may be formed in the second subpixel SP2, a blue light emitting layer for emitting blue light may be formed in the third subpixel SP3, and a white light emitting layer for emitting white light may be formed in the fourth subpixel SP4. In this case, the light emitting layers of the organic light emitting layer 130 are not formed in the transmissive area TA.

The second electrode 140 may be provided over the organic light emitting layer 130 and the bank 125. The second electrode 140 may be provided in the transmissive area TA as well as the non-transmissive area NTA including the emission area EA, but is not limited thereto. In some embodiments, the second electrode 140 is only provided in the non-transmissive area NTA including the emission area EA, but may not be provided in the transmissive area TA to improve transmittance.

The second electrode 140 may be a common layer commonly formed for the subpixels SP1, SP2, SP3 and SP4 to apply the same or substantially the same voltage to the subpixels. The second electrode 140 may be formed of a transparent conductive material (TCO) such as ITO and IZO, which can transmit light, or may be formed of a semi-transmissive conductive material such as Mg, Ag, or alloy of Mg and Ag. When the second electrode 140 is formed of a semi-transmissive conductive material, emission efficiency may be enhanced by micro cavity. The second electrode 140 may be a cathode electrode.

An encapsulation film 150 may be provided over the light emitting diodes. The encapsulation film 150 may be formed over the second electrode 140 to overlay the second electrode 140. The encapsulation film 150 serves to prevent oxygen or moisture from being permeated into the organic light emitting layer 130 and the second electrode 140. To this end, the encapsulation film 150 may include at least one inorganic film and at least one organic film.

Meanwhile, although not shown in FIG. 6, a capping layer may additionally be formed between the second electrode 140 and the encapsulation film 150.

The black matrix BM, as described with reference to FIG. 3, may include a first black matrix BM1 provided among the plurality of subpixels SP1, SP2, SP3 and SP4, a second black matrix BM2 provided between each of the plurality of subpixels SP1, SP2, SP3 and SP4 and the transmissive area TA, a third black matrix BM3 provided between the pixels P disposed to be adjacent to each other in a first direction, and a fourth black matrix BM4 provided between the pixels P disposed to be adjacent to each other in a second direction.

In one embodiment, the second black matrix BM2 may not be provided between the fourth subpixel SP4 and the transmissive area TA. Since the white light emitted from the fourth subpixel SP4 is not varied depending on a viewing angle, the transparent display panel 110 according to one embodiment of the present disclosure may improve transmittance and reduce light loss caused by the second black matrix BM2 as the second black matrix BM2 is not provided between the fourth subpixel SP4 and the transmissive area TA.

In one embodiment, the second black matrix BM2 may be provided with an opening area OA for exposing the connection electrode CE of the first electrode 120 provided in each of the plurality of subpixels SP1, SP2, SP3 and SP4. Laser may be irradiated to the connection electrode CE of the first electrode 120 during a repair process. For laser irradiation to an exact position, the connection electrode CE of the first electrode 120 may be exposed without being overlaid by the second black matrix BM2.

The aforementioned black matrix BM may include a material that absorbs light, for example, a black dye that fully absorbs light of a visible light wavelength range.

A color filter layer 170 may define the non-transmissive area NTA in the display area DA. In detail, an area provided with color filters CF and the black matrix BM may become the non-transmissive area NTA, and the other area may become the transmissive area TA.

Figure 7:
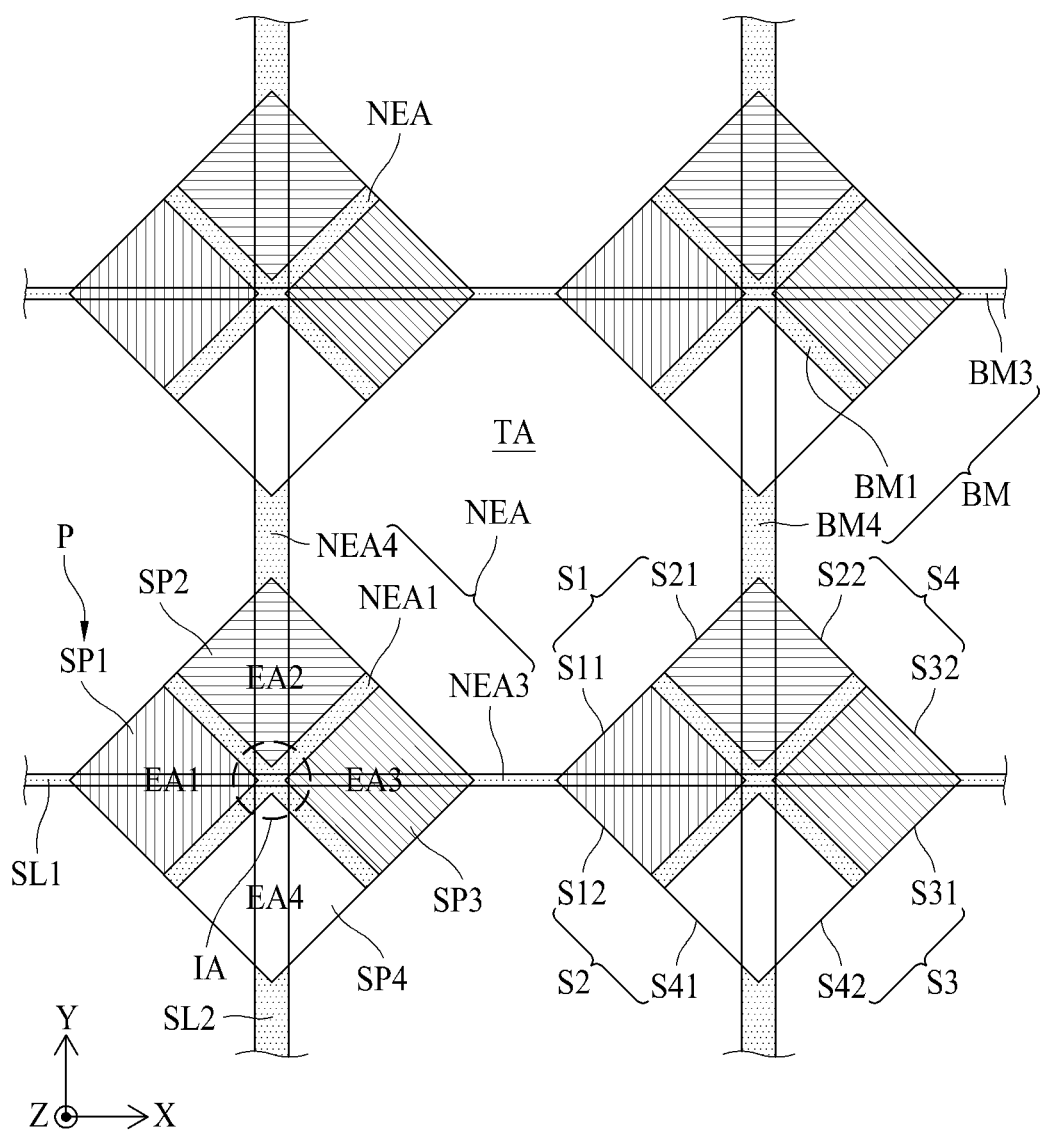
FIG. 7 is a schematic view illustrating another embodiment of a pixel provided in an area A of FIG. 2.

FIG. 7 is a schematic view illustrating another embodiment of a pixel provided in an area A of FIG. 2.

The pixel shown in FIG. 7 is substantially the same as that shown in FIG. 3 except the black matrix BM. Hereinafter, a description of the pixel shown in FIG. 7 will be given based on a difference from the pixel shown in FIG. 3, and a detailed description of elements except the black matrix BM will be omitted.

The transparent display panel 110 is categorized into a display area DA provided with pixels P to display an image, and a non-display area NDA for not displaying an image. The display area DA includes a transmissive area TA and a non-transmissive area NTA.

The non-transmissive area NTA may be provided with a first signal line SL1 extended in a first direction (e.g., X-axis direction), a second signal line SL2 extended in a second direction (e.g., Y-axis direction), and a pixel P provided in an overlapping area IA where the first signal line SL1 and the second signal line SL2 cross each other.

Each of the pixels P may include a first subpixel SP1 disposed to overlap a part of the first signal line SL1, a second subpixel SP2 disposed to overlap a part of the second signal line SL2, a third subpixel SP3 disposed to face the first subpixel SP1 based on the overlapping area IA, and a fourth subpixel SP4 disposed to face the second subpixel SP2 based on the overlapping area IA.

The non-transmissive area NTA may include an emission area EA and a non-emission area NEA.

The emission area EA may be provided with a plurality of subpixels SP1, SP2, SP3 and SP4 to emit light of a predetermined or selected color, and may include a first emission area EA1, a second emission area EA2, a third emission area EA3, and a fourth emission area EA4, which are respectively provided in the plurality of subpixels SP1, SP2, SP3 and SP4.

The non-emission area NEA may not emit light, and may include a first non-emission area NEA1 provided among the plurality of subpixels SP1, SP2, SP3 and SP4, a third non-emission area NEA3 provided between the pixels P disposed to be adjacent to each other in a first direction, and a fourth non-emission area NEA4 provided between the pixels P disposed to be adjacent to each other in a second direction.

The non-emission area NEA may be provided with a black matrix BM. The black matrix BM may include a first black matrix BM1 provided among the plurality of subpixels SP1, SP2, SP3 and SP4, a third black matrix BM3 provided between the pixels P disposed to be adjacent to each other in a first direction, and a fourth black matrix BM4 provided between the pixels P disposed to be adjacent to each other in a second direction.

Since the black matrix BM is made of a material that shields or absorbs light, the black matrix BM may greatly affect transmittance of the transparent display panel 110. In detail, transmittance of the transparent display panel 110 may be reduced as the area where the black matrix BM is formed, that is, the non-emission area NEA is increased. On the other hand, transmittance of the transparent display panel 110 may be increased as the non-emission area NEA is reduced.

The transparent display panel 110 according to another embodiment of the present disclosure is not provided with a second black matrix BM2 as compared with the transparent display panel 110 shown in FIG. 3, whereby the area where the black matrix BM is formed, that is, the non-emission area NEA may be reduced. Therefore, the transparent display panel 110 according to another embodiment of the present disclosure may more improve transmittance than the transparent display panel 110 shown in FIG. 3.

Figure 8:
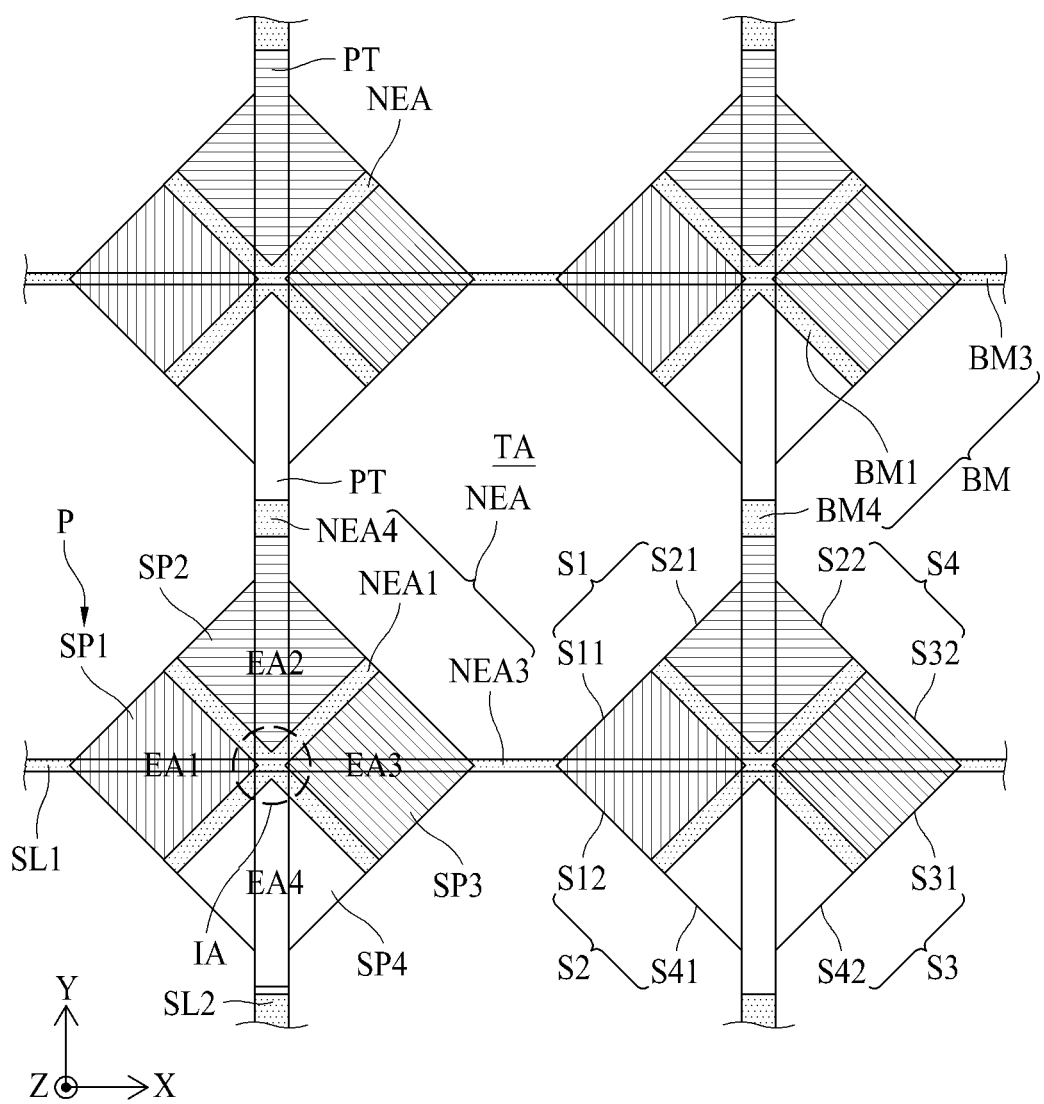
FIG. 8 is a schematic view illustrating still another embodiment of a pixel provided in an area A of FIG. 2.

FIG. 8 is a schematic view illustrating still another embodiment of a pixel provided in an area A of FIG. 2.

The pixel shown in FIG. 8 is substantially the same as that shown in FIG. 7 except a shape of the emission area EA. Hereinafter, a description of the pixel shown in FIG. 8 will be given based on a difference from the pixel shown in FIG. 7, and a detailed description of elements except the shape of the emission area EA will be omitted.

The transparent display panel 110 is categorized into a display area DA provided with pixels P to display an image, and a non-display area NDA for not displaying an image. The display area DA includes a transmissive area TA and a non-transmissive area NTA.

The non-transmissive area NTA may be provided with a first signal line SL1 extended in a first direction (e.g., X-axis direction), a second signal line SL2 extended in a second direction (e.g., Y-axis direction), and a pixel P provided in an overlapping area IA where the first signal line SL1 and the second signal line SL2 cross each other.

Each of the pixels P may include a first subpixel SP1, a second subpixel SP2, a third subpixel SP3, and a fourth subpixel SP4.

The first subpixel SP1 may include a first emission area EA1 disposed to overlap a part of the first signal line SL1, emitting light of a first color. The second subpixel SP2 may include a second emission area EA2 disposed to overlap a part of the second signal line SL2, emitting light of a second color. The third subpixel SP3 may include a third emission area EA3 disposed to face the first subpixel SP1 based on the overlapping area IA, emitting light of a third color. The fourth subpixel SP4 may include a fourth emission area EA4 disposed to face the second subpixel SP2 based on the overlapping area IA, emitting light of a fourth color.

In the transparent display panel 110 according to still another embodiment of the present disclosure, each of the second subpixel SP2 and the fourth subpixel SP4, which are overlapped with a part of the second signal line SL2, includes a protrusion area PT.

In detail, the second emission area EA2 of the second subpixel SP2 may include a protrusion area PT protruded toward the subpixel, for example, the fourth subpixel SP4 of the pixel P adjacent thereto on the second signal line SL2.

The fourth emission area EA4 of the fourth subpixel SP4 may include a protrusion area PT protruded toward the subpixel of the pixel P adjacent thereto on the second signal line SL2, for example, the second subpixel SP2.

In this case, the protrusion area PT of each of the second subpixel SP2 and the fourth subpixel SP4 may have the same or substantially the same width as that of the second signal line SL2. Therefore, the transparent display panel 110 according to still another embodiment of the present disclosure may increase the size of the emission area EA without reducing the size of the transmissive area TA. That is, the transparent display panel 110 according to still another embodiment of the present disclosure may improve emission efficiency without reducing transmittance.

The non-transmissive area NTA may include an emission area EA and a non-emission area NEA.

The emission area EA may be provided with a plurality of subpixels SP1, SP2, SP3 and SP4 to emit light of a predetermined or selected color, and may include a first emission area EA1, a second emission area EA2, a third emission area EA3, and a fourth emission area EA4, which are respectively provided in the plurality of subpixels SP1, SP2, SP3 and SP4.

The non-emission area NEA may not emit light, and may include a first non-emission area NEA1 provided among the plurality of subpixels SP1, SP2, SP3 and SP4, a third non-emission area NEA3 provided between the pixels P disposed to be adjacent to each other in a first direction, and a fourth non-emission area NEA4 provided between the pixels P disposed to be adjacent to each other in a second direction.

The non-emission area NEA may be provided with a black matrix BM. The black matrix BM may include a first black matrix BM1 provided among the plurality of subpixels SP1, SP2, SP3 and SP4, a third black matrix BM3 provided between the pixels P disposed to be adjacent to each other in a first direction, and a fourth black matrix BM4 provided between the pixels P disposed to be adjacent to each other in a second direction.

Since the black matrix BM is made of a material that shields or absorbs light, the black matrix BM may greatly affect transmittance of the transparent display panel 110. In detail, transmittance of the transparent display panel 110 may be reduced when the area where the black matrix BM is formed, that is, the non-emission area NEA is increased. On the other hand, transmittance of the transparent display panel 110 may be increased as the non-emission area NEA is reduced.

In the transparent display panel 110 according to still another embodiment of the present disclosure, each of the second subpixel SP2 and the fourth subpixel SP4 may be protruded toward the pixels P disposed to be adjacent to each other in the first direction. Therefore, in the transparent display panel 110 according to still another embodiment of the present disclosure, the area where the third black matrix BM3 is formed may be reduced as compared with the transparent display panels 110 shown in FIG. 3 and FIG. 7.

Consequently, the transparent display panel 110 according to still another embodiment of the present disclosure may have transmittance more improved than that of the transparent display panel 110 shown in FIG. 3 and FIG. 7 while increasing the emission area EA.

Figure 9:
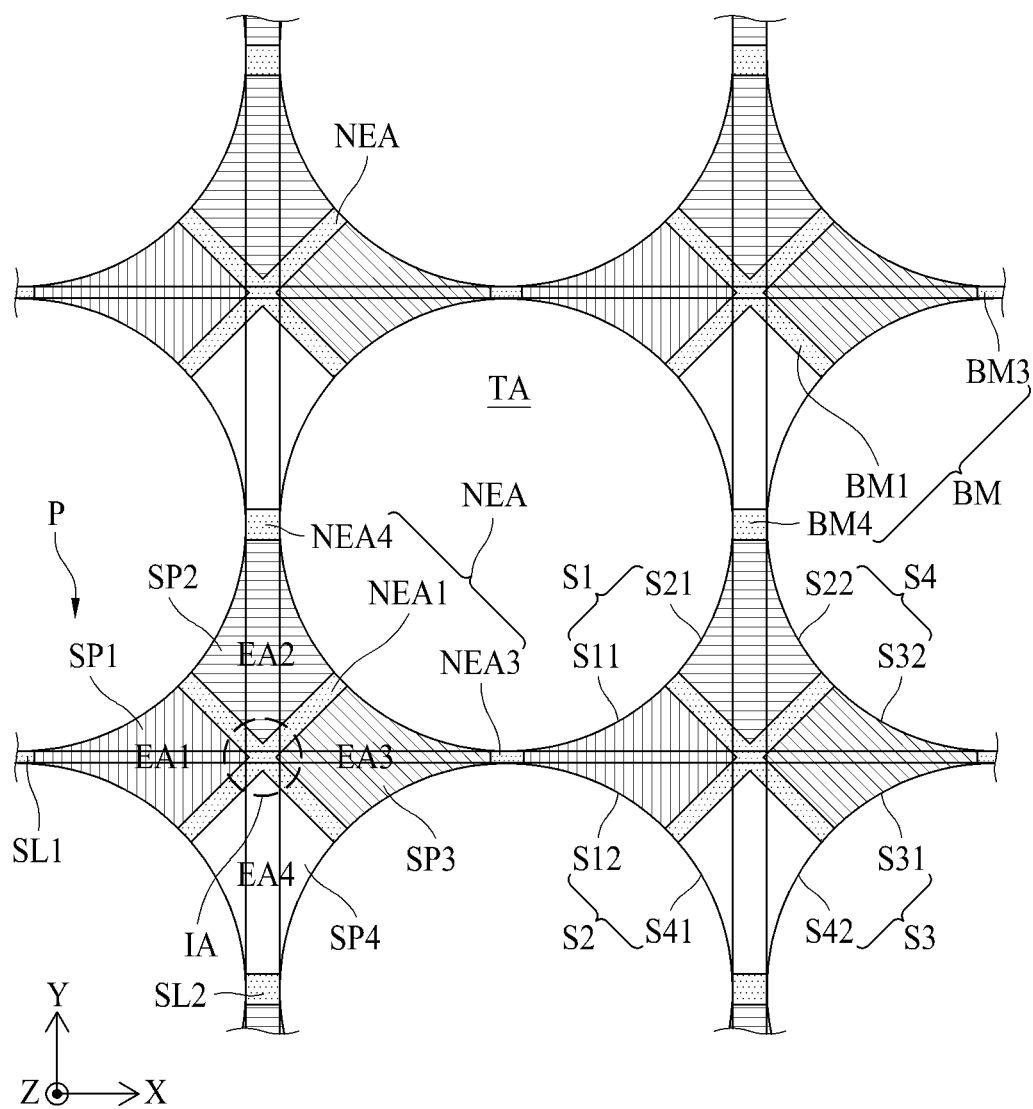
FIG. 9 is a schematic view illustrating further still another embodiment of a pixel provided in an area A of FIG. 2.
Figure 10:
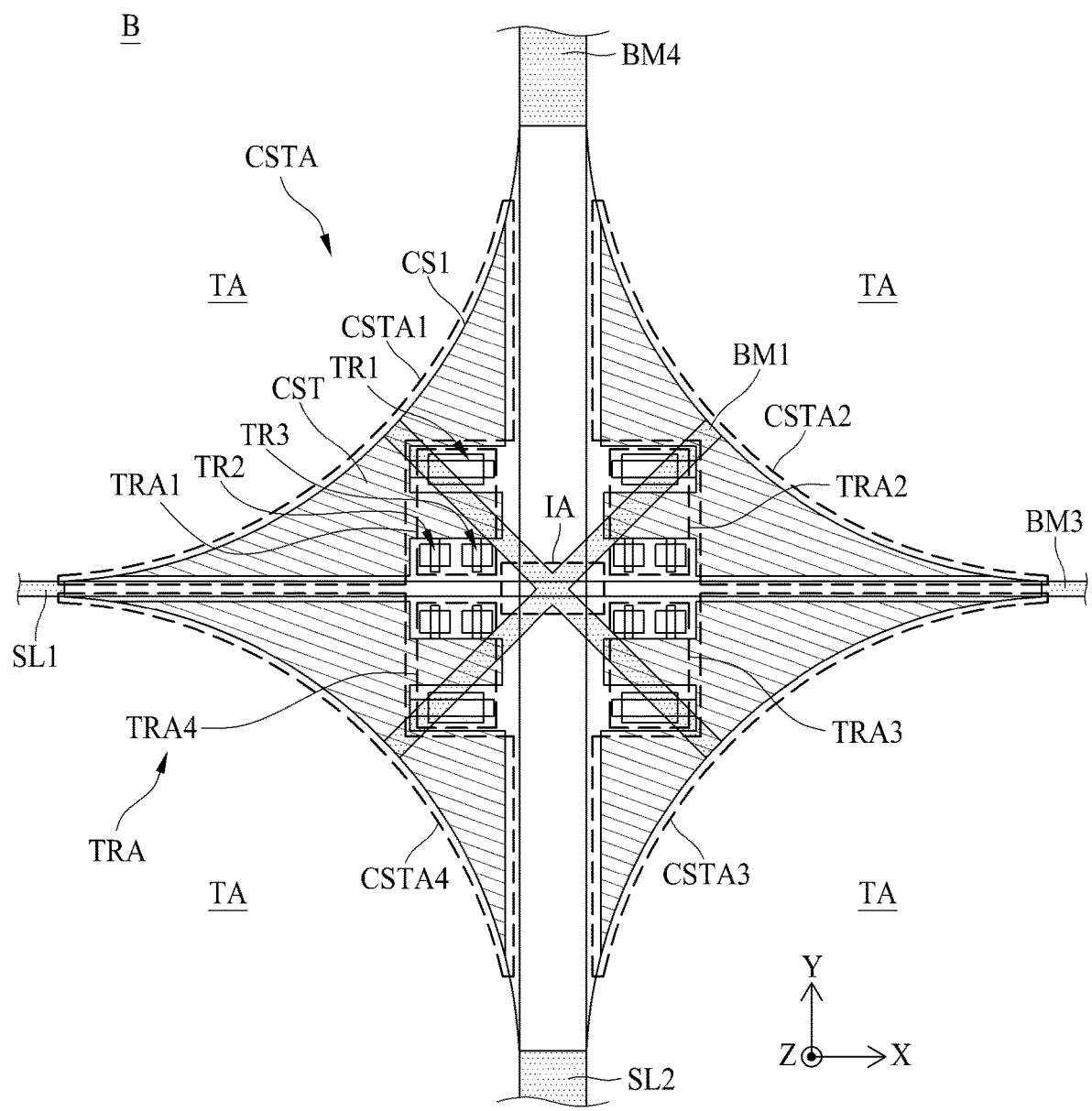
FIG. 10 is a schematic view illustrating a transistor and a capacitor in an area B of FIG. 9.
Figure 11:
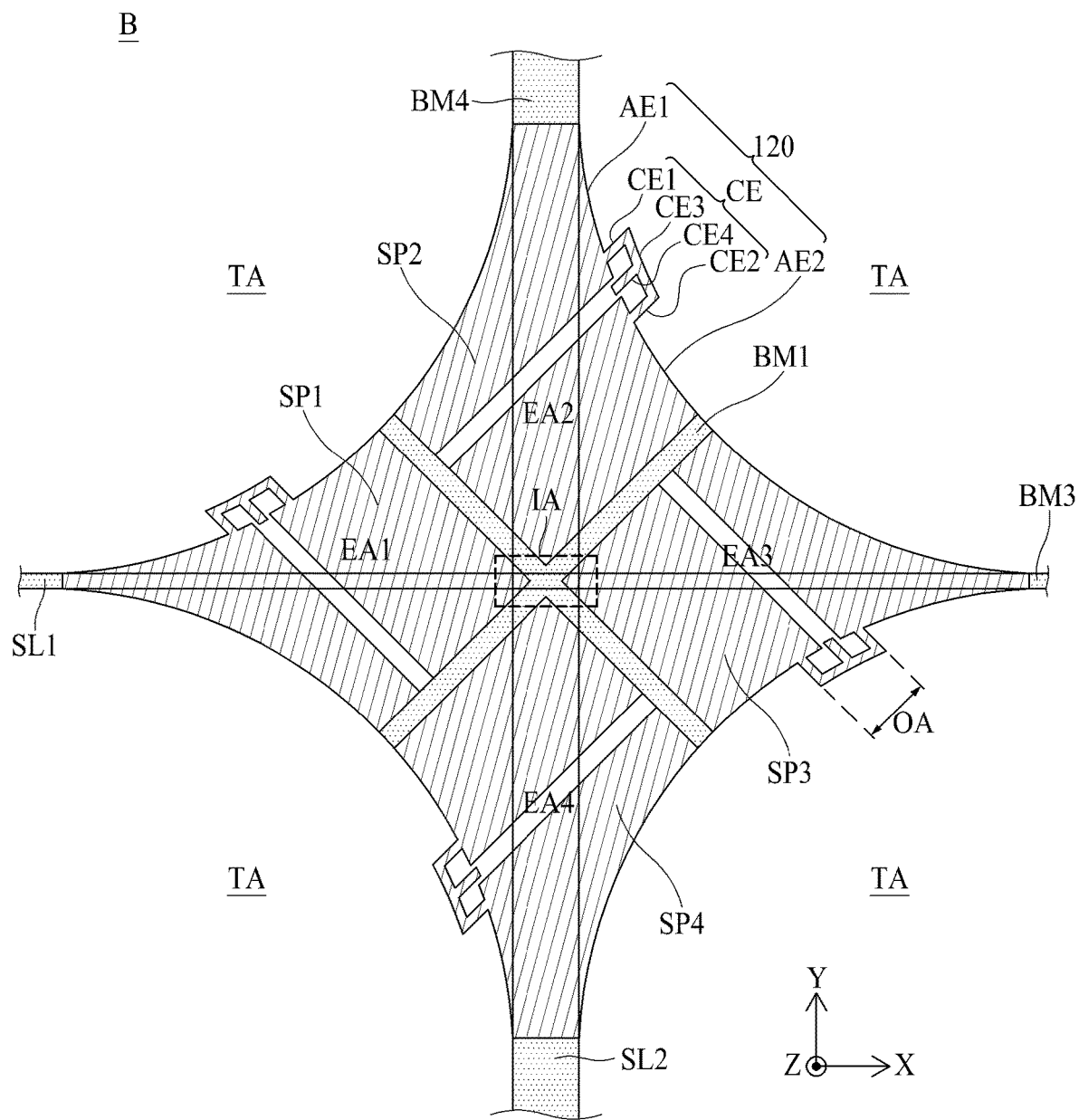
FIG. 11 is a schematic view illustrating a first electrode in an area B of FIG. 9.

FIG. 9 is a schematic view illustrating further still another embodiment of a pixel provided in an area A of FIG. 2, FIG. 10 is a schematic view illustrating a transistor and a capacitor in an area B of FIG. 9, and FIG. 11 is a schematic view illustrating a first electrode in an area B of FIG. 9.

The pixel shown in FIG. 9 is substantially the same as that shown in FIG. 7 except shapes of the emission area EA and the transmissive area TA. Hereinafter, a description of the pixel shown in FIG. 9 will be given based on a difference from the pixel shown in FIG. 7, and a detailed description of elements except the shapes of the emission area EA and the transmissive area TA will be omitted.

The transparent display panel 110 is categorized into a display area DA provided with pixels P to display an image, and a non-display area NDA for not displaying an image. The display area DA includes a transmissive area TA and a non-transmissive area NTA.

The non-transmissive area NTA may be provided with a first signal line SL1 extended in a first direction (e.g., X-axis direction), a second signal line SL2 extended in a second direction (e.g., Y-axis direction), and a pixel P provided in an overlapping area IA where the first signal line SL1 crosses the second signal line SL2.

Each of the pixels P may include a first subpixel SP1, a second subpixel SP2, a third subpixel SP3, and a fourth subpixel SP4.

The first subpixel SP1 may include a first emission area EA1 disposed to overlap a part of the first signal line SL1, emitting light of a first color. The second subpixel SP2 may include a second emission area EA2 disposed to overlap a part of the second signal line SL2, emitting light of a second color. The third subpixel SP3 may include a third emission area EA3 disposed to face the first subpixel SP1 based on the overlapping area IA, emitting light of a third color. The fourth subpixel SP4 may include a fourth emission area EA4 disposed to face the second subpixel SP2 based on the overlapping area IA, emitting light of a fourth color.

In the transparent display panel 110 according to further still another embodiment of the present disclosure, the pixel P may include a plurality of sides oriented toward the transmissive area TA, and each of the plurality of sides of the pixel P may be inclined with respect to each of the first signal line SL1 and the second signal line SL2.

In detail, the pixel P may include first and second sides S1 and S2 oriented toward the transmissive area TA, a third side S3 facing the first side S1, and a fourth side S4 facing the second side S2.

Each of the first side S1, the second side S2, the third side S3 and the fourth side S4 of the pixel P may be inclined without being parallel with or vertical to the first signal line SL1. Each of the first side S1, the second side S2, the third side S3 and the fourth side S4 of the pixel P may be formed with a curve recessed toward the overlapping area IA. In this case, the transmissive area TA may have a square shape of rounded corners, a circular shape or an oval shape in accordance with the size and arrangement of the pixel P.

When the non-transmissive areas NTA are disposed at a certain interval, a slit, specifically the transmissive area TA having a square shape may be formed between the non-transmissive areas NTA. When external light passes through the slit, a diffraction phenomenon may occur.

The diffraction phenomenon means that light corresponding to plane waves may be changed to spherical waves as the light passes through the slit and an interference phenomenon may occur in the spherical waves. Therefore, interpolation interference and offset interference occur in the spherical waves, whereby the external light that has passed through the slit may have irregular light intensity. As a result, in the transparent display panel 110, definition of an object or image located at an opposite side may be reduced.

In the transparent display panel 110 according to further still another embodiment of the present disclosure, each of the plurality of sides S1, S2, S3 and S4 of the pixel P may be formed with a curve recessed toward the overlapping area IA, whereby diffraction may be prevented from occurring in external light that passes through the transmissive area TA.

Meanwhile, the transparent display panel 110 according to further still another embodiment of the present disclosure may include a first circuit area TRA provided with at least one or more transistors TR1, TR2 and TR3 and a second circuit area CSTA provided with a capacitor CST in the non-transmissive area NTA as shown in FIG. 10.

The first circuit area TRA may include a first transistor area TRA1 disposed between the first signal line SL1 and the second signal line SL2, a second transistor area TRA2 disposed to be symmetrical with the first transistor area TRA1 based on the second signal line SL2, a third transistor area TRA3 disposed to be symmetrical with the second transistor area TRA2 based on the first signal line SL1, and a fourth transistor area TRA4 disposed to be symmetrical with the first transistor area TRA1 based on the second signal line SL2.

The driving transistor TR1, the switching transistor TR2 and the sensing transistor TR3 may be provided in each of the first to fourth transistor areas TRA1, TRA2, TRA3 and TRA4.

The second circuit area CSTA may be disposed between the first circuit area TRA and the transmissive area TA. In detail, the second circuit area CSTA may include a first capacitor area CSTA1 disposed between the first transistor area TRA1 and the transmissive area TA, a second capacitor area CSTA2 disposed between the second transistor area TRA2 and the transmissive area TA, a third capacitor area CSTA3 disposed between the third transistor area TRA3 and the transmissive area TA, and a fourth capacitor area CSTA4 disposed between the fourth transistor area TRA4 and the transmissive area TA.

The capacitor CST may be provided in each of the first to fourth capacitor areas CSTA1, CSTA2, CSTA3 and CSTA4.

In the capacitor CST, at least one side oriented toward the transmissive area TA may have the same or substantially the same shape as that of the pixel P. In detail, in the capacitor CST, at least one side oriented toward the transmissive area TA may be inclined with respect to each of the first signal line SL1 and the second signal line SL2.

The capacitor CST may include one first side CS1 oriented toward the transmissive area TA. The first side CS1 of the capacitor CST may be inclined without being parallel with or vertical to the first signal line SL1 and the second signal line SL2. Also, the first side CS1 of the capacitor CST may be comprised of a curve recessed toward the overlapping area IA.

The capacitor CST may be provided to have a maximum wide area in an area excluding the second circuit area CSTA, the first signal line SL1 and the second signal line SL2 from the pixel P. To this end, in the transparent display panel 110 according to further still another embodiment of the present disclosure, the first side CS1 of the capacitor CST may have the same or substantially the same shape as that of the side oriented toward the transmissive area TA of the subpixels SP1, SP2, SP3 and SP4. Moreover, in the transparent display panel 110 according to further still another embodiment of the present disclosure, an end of the first side CS1 of the capacitor CST may be equal to that of the side oriented toward the transmissive area TA of the subpixels SP1, SP2, SP3 and SP4.

In the transparent display panel 110 according to further still another embodiment of the present disclosure, as shown in FIG. 11, at least one side oriented toward the transmissive area TA of the first electrode 120 may have the same or substantially the same shape as that of the first side CS1 of the capacitor CST. In detail, at least one side oriented toward the transmissive area TA in the first electrode 120 may be comprised of a curve recessed toward the overlapping area IA. In one embodiment, the capacitor CST may have the same end as that of the first electrode 120 at the side oriented toward the transmissive area TA.

The transparent display panel 110 according to further still another embodiment of the present disclosure described as above may make sure of maximum capacity of the capacitor CST and improve luminance.

Also, in the transparent display panel 110 according to further still another embodiment of the present disclosure, the first side CS1 of the capacitor CST is formed with a curve toward the overlapping area IA, whereby the transmissive area TA having a square shape of rounded corners, a circular shape or an oval shape may easily be formed. Also, the transparent display panel 110 according to further still another embodiment of the present disclosure may make sure of high transmittance while making sure of a maximum size of the emission area EA as the side oriented toward the transmissive area TA of the subpixels SP1, SP2, SP3 and SP4 is formed along the first side CS1 of the capacitor CST.

In the transparent display panel 110 according to further still another embodiment of the present disclosure, even though the transmissive area TA is formed in a square shape having rounded corners, a circular shape or an oval shape, a size of the non-transmissive area between the subpixels SP1, SP2, SP3 and SP4 and the transmissive area TA may be prevented from being remarkably increased. Therefore, the transparent display panel 110 according to further still another embodiment of the present disclosure may increase definition of an object or image located at an opposite side without reducing transmittance.

Figure 12:
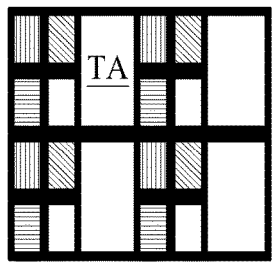
FIG. 12 is a view illustrating transparency and an aperture ratio of a light emitting portion in each of a comparison example, Embodiment 1 and Embodiment 2.
Figure 12:
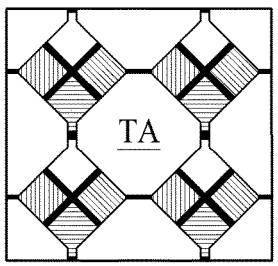
Figure 12:
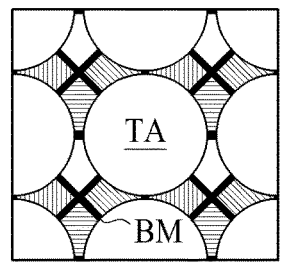

FIG. 12 is a view illustrating transparency and an aperture ratio of a light emitting portion in each of a comparison example, Embodiment 1 and Embodiment 2.

Referring to FIG. 12, in the comparison example, the transmissive area TA has a rectangular shape, and pixels also have a rectangular shape. The Embodiment 1 has the transmissive area TA and pixels shown in FIG. 8, and the Embodiment 2 has the transmissive area TA and pixels shown in FIG. 9. That is, the transmissive area TA has an octagonal shape in the Embodiment 1, and the transmissive area TA has a circular shape in the Embodiment 2.

In the transparent display panel 110 having the transmissive area TA and the pixels like the comparison example, it is noted that the aperture ratio of the light emitting portion is 30.0%, and transparency is 43.8%.

In the transparent display panel 110 having the transmissive area TA and the pixels like the Embodiment 1, it is noted that the aperture ratio of the light emitting portion is 30.0% in the same or similar manner as the comparison example. However, in the transparent display panel 110 having the transmissive area TA and the pixels like the Embodiment 1, it is noted that transparency is 50.0% higher than that of the comparison example as much as 6.2%. That is, the transparent display panel 110 having the transmissive area TA and the pixels like the Embodiment 1 has transparency more improved than that of the transparent display panel 110 having the transmissive area TA and the pixels like the comparison example.

In the transparent display panel 110 having the transmissive area TA and the pixels like the Embodiment 2, it is noted that the aperture ratio of the light emitting portion is 30.0% in the same or similar manner as the comparison example. However, in the transparent display panel 110 having the transmissive area TA and the pixels like the Embodiment 2, it is noted that transparency is 49.5% higher than that of the comparison example as much as 5.7%. That is, the transparent display panel 110 having the transmissive area TA and the pixels like the Embodiment 2 has transparency more improved than that of the transparent display panel 110 having the transmissive area TA and the pixels like the comparison example.

Meanwhile, the transparent display panel 110 having the transmissive area TA and the pixels like the Embodiment 2 has transparency lower than that of the transparent display panel 110 having the transmissive area TA and the pixels like the Embodiment 1 as much as 0.5%. In the transparent display panel 110 having the transmissive area TA and the pixels like the Embodiment 2, transparency is lower than that of the transparent display panel 110 having the transmissive area TA and the pixels like the Embodiment 1 but the transmissive area TA is formed in a circular shape, whereby definition of an object or image located at an opposite side may be improved.

According to the present disclosure, the plurality of sides of the pixel are provided to be inclined, the outer length of the transmissive area may be reduced or minimized. Therefore, the area where the black matrix is formed, that is, the non-light emission area may be reduced, and transmittance may be improved.

Also, according to the present disclosure, the plurality of subpixels are together disposed based on the overlapping area where the first signal line and the second signal line cross each other, whereby definition of picture quality and readability may be improved.

Also, according to the present disclosure, each of the plurality of sides of the pixel may be formed to include a side of each of at least two or more subpixels. That is, according to the present disclosure, the non-light emission area provided between the respective subpixels may be provided between the overlapping area and any one point of the intermediate area of each of the sides of the pixel. Therefore, according to the present disclosure, the size of the non-light emission area provided between the respective subpixels may be reduced, whereby transmittance may be improved.

Also, according to the present disclosure, the first circuit area provided with at least one transistor and the second circuit area provided with a capacitor may be disposed so as not to overlap a part of the signal lines. Therefore, according to the present disclosure, a parasitic cap may be prevented from occurring among the transistor, the capacitor and the signal lines.

Also, according to the present disclosure, the first circuit area may be disposed to be adjacent to the overlapping area, whereby the length of the connection line for connecting the transistor with the signal line may be reduced or minimized. Therefore, according to the present disclosure, loss of a voltage, which is transferred from the signal line, due to resistance may be reduced.

Also, according to the present disclosure, the capacitor may be disposed between the first circuit area and the transmissive area, and may be provided to have a maximum wide area in the area except the first circuit area and the signal lines. Therefore, according to the present disclosure, it is possible to make sure of maximum capacity of the capacitor, whereby luminance may be improved.

Also, according to the present disclosure, the shape of the transmissive area may be determined by the shape of the side of the capacitor, which is oriented toward the transmissive area. Therefore, according to the present disclosure, a degree of freedom in design of the transmissive area may be acquired without loss of transmittance.

Also, according to the present disclosure, the side of the capacitor, which is oriented toward the transmissive area, may be formed with a curve oriented toward the overlapping area, whereby the transmissive area may have a square shape of rounded corners, an oval shape or a circular shape. Therefore, according to the present disclosure, a diffraction phenomenon may be prevented from occurring in external light that passes through the transmissive area, and definition of an object or image located on a rear surface may be improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
   a plurality of first signal lines extended in a first direction and disposed to be spaced apart from one another;
   a plurality of second signal lines extended in a second direction and disposed to be spaced apart from one another;
   a transmissive area provided between two first signal lines adjacent to each other and two second signal lines adjacent to each other; and
   a pixel disposed at an overlapping area where a first signal line of the plurality of first signal lines and a second signal line of the plurality of second signal lines cross each other, the pixel including a plurality of subpixels having different colors,
   wherein at least one side oriented toward the transmissive area in each of the plurality of subpixels has an inclination with respect to each of the first signal line and the second signal line,
   wherein the inclination of each of the plurality of subpixels with respect to either the first signal line or the second signal line is greater than 0 degrees and less than 90 degrees, and
   wherein each subpixel with different colors is in proximity to the overlapping area.

2. The transparent display device of claim 1, wherein the plurality of subpixels include a first subpixel overlapped with a part of the first signal line, a second subpixel overlapped with a part of the second signal line, a third subpixel facing the first subpixel based on the overlapping area, and a fourth subpixel facing the third subpixel based on the overlapping area.

3. The transparent display device of claim 1, wherein each of the plurality of subpixels includes a first side and a second side, which are oriented toward the transmissive area, and each of the first side and the second side has an inclination with respect to each of the first signal line and the second signal line.

4. The transparent display device of claim 1, wherein the pixel includes a plurality of sides oriented toward the transmissive area, and each of the plurality of sides of the pixel has an inclination with respect to each of the first signal line and the second signal line.

5. The transparent display device of claim 4, wherein each of the plurality of sides of the pixel is a straight line.

6. The transparent display device of claim 1, wherein the pixel has a rhombus shape.

7. The transparent display device of claim 6, wherein each of the plurality of subpixels has a rhombus shape.

8. The transparent display device of claim 1, wherein the transmissive area has a shape that is one of a rhombus shape, a hexagonal shape and an octagonal shape.

9. The transparent display device of claim 1, wherein each of the plurality of subpixels includes a first anode electrode, a second anode electrode disposed to be spaced apart from the first anode electrode, and a connection electrode electrically connecting the first anode electrode with the second anode electrode, and a connection electrode of one subpixel is only disposed in each of the plurality of sides of the pixel.

10. The transparent display device of claim 1, further comprising:
a first black matrix provided among the plurality of subpixels, and
a second black matrix provided between each of the plurality of subpixels and the transmissive area.

11. The transparent display device of claim 10, wherein each of the plurality of subpixels includes a first anode electrode, a second anode electrode disposed to be spaced apart from the first anode electrode, and a connection electrode electrically connecting the first anode electrode with the second anode electrode, and the second black matrix includes an opening area for exposing the connection electrode.

12. The transparent display device of claim 10, wherein the plurality of subpixels include a white subpixel, and the second black matrix is provided between each of the other subpixels except the white subpixel and the transmissive area.

13. The transparent display device of claim 1, further comprising:
a driving transistor including an active layer, a gate electrode, a source electrode, and a drain electrode; and
a capacitor including at least two or more capacitor electrodes,
wherein each of the driving transistor and the capacitor does not overlap each of the first signal line and the second signal line.

14. The transparent display device of claim 13, wherein the driving transistor is disposed to be more adjacent to the overlapping area than the capacitor.

15. The transparent display device of claim 13, wherein each of the plurality of subpixels includes a light emitting portion comprised of an anode electrode, a light emitting layer and a cathode electrode, and the light emitting portion has the same end as that of at least one of the capacitor electrodes at a side oriented toward the transmissive area.

16. The transparent display device of claim 1, wherein at least one of the plurality of subpixels included in one pixel includes a protrusion area protruded in a direction of another pixel adjacent thereto.

17. The transparent display device of claim 1, wherein the second signal line includes a gate line, and the first signal line includes at least one of a reference line, a first power line, a second power line, or a data line.

18. A transparent display device comprising:
a plurality of first signal lines extended in a first direction and disposed to be spaced apart from one another;
a plurality of second signal lines extended in a second direction and disposed to be spaced apart from one another;
a transmissive area provided between two first signal lines adjacent to each other and two second signal lines adjacent to each other; and
a pixel provided in an overlapping area where a first signal line of the plurality of first signal lines and a second signal line of the plurality of second signal lines cross each other, including a first circuit area provided with at least one transistor and a second circuit area provided with at least one capacitor, the pixel including a plurality of subpixels having different colors,
wherein at least one side of the second circuit area, which is oriented toward the transmissive area, has an inclination with respect to each of the first signal line and the second signal line,
wherein the inclination with respect to each of the first signal line and the second signal line is greater than 0 degrees and less than 90 degrees, and
wherein each subpixel with different colors partially overlaps with overlapping area from a plan view.

19. The transparent display device of claim 18, wherein the second circuit area is disposed between the first circuit area and the transmissive area.

20. The transparent display device of claim 18, wherein the first circuit area and the second circuit area do not overlap the first signal line and the second signal line.

21. The transparent display device of claim 18, wherein the capacitor is comprised of an oblique line with respect to each of the first signal line and the second signal line at a side oriented toward the transmissive area or a curve recessed toward the overlapping area.

22. The transparent display device of claim 18, wherein the pixel includes a plurality of subpixels, and a side oriented toward the transmissive area in each of the plurality of subpixels has substantially the same shape as that of the capacitor, and wherein each of the plurality of subpixels has the same end as that of the capacitor at the side oriented toward the transmissive area.

23. The transparent display device of claim 18, wherein the first circuit area includes a first transistor area disposed between the first signal line and the second signal line, a second transistor area disposed to be symmetrical with the first transistor area based on the second signal line, a third transistor area disposed to be symmetrical with the second transistor area based on the first signal line, and a fourth transistor area disposed to be symmetrical with the first transistor area based on the second signal line, and a driving transistor, a switching transistor and a sensing transistor are provided in each of the first to fourth transistor areas.

* * * * *